United States Patent [19]

Yamasita et al.

[11] Patent Number: 5,214,541
[45] Date of Patent: May 25, 1993

[54] METHOD FOR PRODUCING COLOR FILTER

[75] Inventors: Yukio Yamasita, Yokohama; Haruyoshi Sato, Kawasaki; Toru Nakamura, Yokohama; Hitoshi Yuasa, Yokohama; Yutaka Otsuki, Yokohama, all of Japan

[73] Assignee: Nippon Oil Co., Ltd., Tokyo, Japan

[21] Appl. No.: 874,064

[22] Filed: Apr. 24, 1992

[30] Foreign Application Priority Data

Jun. 12, 1991 [JP] Japan .................. 3-140271

[51] Int. Cl.$^5$ .............................. G02B 5/22
[52] U.S. Cl. .................... 359/891; 359/900; 430/7
[58] Field of Search ............. 359/885, 886, 887, 888, 359/890, 891, 68, 900; 430/5, 6, 7, 293, 300, 301, 302

[56] References Cited

U.S. PATENT DOCUMENTS

| 4,239,842 | 12/1980 | Sandhu | 430/7 |
| 4,271,246 | 6/1981 | Sato et al. | 430/7 |
| 4,837,098 | 6/1989 | Shimamura et al. | 430/7 |

Primary Examiner—Loha Ben
Attorney, Agent, or Firm—Darby & Darby

[57] ABSTRACT

A method for producing a color filter involves (A) forming a photosensitive coating film on a transparent electrically conductive layer provided on an outermost surface of a substrate having an alignment film, and exposing the photosensitive coating film to light through a mask having patterns of at least three different degrees of light transmittances; (B) developing and removing a photosensitive coating film portion registering with one of the patterns of smallest and largest degrees of light transmittances for exposing the transparent electrically conductive layer and electrodepositing a colored coating on the exposed electrically conductive layer for forming a colored layer thereon, operation of developing and removing the photosensitive coating film and electrodepositing the colored coating being repeated for the respective patterns of different degrees of light transmittances in sequence of difference in light transmittances to form different colored layers, respectively; and (Z) transcribing the colored layers, the transparent electrically conductive layer and the alignment film onto another substrate.

48 Claims, 2 Drawing Sheets

METHOD FOR PRODUCING COLOR FILTER

BACKGROUND OF THE INVENTION

This invention relates to a method for producing a color filter and more particularly to a color filter advantageously employed as a color liquid crystal display device.

Among the currently employed methods for preparing a color filter, there are a dyeing method consisting in dyeing a transparent substrate with a binder containing dyes and pigments, a printing method and a pigment dispersion method.

Since the dyeing method consists in selectively forming a thin resin film on a substrate with dyes, a resist printing process and a photolithographic process need to be performed each time the color is changed. Although resist printing is unnecessary with the printing method, there is a limit to the refinement of color patterns and, the larger is the number of colors, the printing position becomes the worse. Although the fine color pattern is possible with the pigment dispersion method, a high precision photolithographic process needs to be performed each time the color is changed, resulting in a complicated process.

For overcoming the deficiency, there is proposed in Japanese Laid-open Patent Application No. 59-114572 (1984) a method for producing a color filter by an electrodeposition coating method. With this method, a transparent electrode is prepared by patterning a transparent electrically conductive film deposited on the substrate, and electrical voltage is applied only to a portion of the patterned transparent electrode which is to be dyed in the same color. The substrate is immersed in a colored electrodeposition bath for forming a colored layer by electrodeposition. Electric voltage is then applied only to a portion of the substrate which is to be dyed in a different color, and the substrate is then immersed in a colored electrodeposition bath for forming a different color layer by electrodeposition. However, it is necessary with this method to perform a high precision patterning of the transparent electrode, and to pay meticulous care during the subsequent process not to break the fine pattern, because otherwise the subsequent coloring process is rendered difficult. Besides, the patterned transparent electrode needs to be electrically continuous, even in fine pattern sections, so that limitations are imposed on the degree of freedom of the pattern shape.

In Japanese Laid-open Patent Application No. 63-210901 (1988), there is proposed a method consisting in forming colored layers by light exposure, development and electrodeposition, using a mask having patterns only in areas to be dyed in the same colors and a positive type photosensitive resin composition, and repeating the steps of light exposure, development and electrodeposition a desired number of times. This method is inferior in stability because it makes use of a compound containing unstable quinone diazido groups. Besides, if the quinone diazido compound is brought into contact with an aqueous alkali solution, the quinone diazido compound in the unexposed part is also reacted with an aqueous alkali solution so that photosensitivity is markedly changed to present difficulties in the subsequent light exposure and development steps.

In these electrodeposition methods a transparent electrode for formation of colored layers is simultaneously used as an electrode for driving a liquid crystal. However, since the colored layers formed on the transparent electrode is made of an insulating material, the liquid crystal driving voltage becomes exceedingly high. For this reason, a transparent electrode for driving the liquid crystal is additionally provided on the colored layers formed in accordance with the above method for lowering the driving voltage. On the other hand, since the transparent electrode employed in the above method has a light transmittance of 80 to 85%, provision of two transparent electrode layers leads to lowered light transmittance to deteriorate the performance as a colored display substrate. For overcoming this defect, there is proposed in Japanese Laid-open Patent Application No. 1-22479 (1989) a method comprising forming a colored layer on a master plate and transferring it onto a transparent substrate. However, since the transfer is effected for each color with this prior-art method, it becomes necessary to achieve high precision alignment for each transfer operation, thus complicating the production.

On the other hand, in order to meet the demand for high performance of the device provided with a color filter, it has been desired to improve contrast and to prevent color purity from being lowered. In order to solve this problem, a method of forming a non-light transmitting film in a region of the color filter defined between neighboring pixels has been proposed. For forming the non-light transmitting film, there are known a method comprising forming pixels with alignment on a substrate on which a non-light transmitting film pattern is formed previously, and a method comprising forming a non-light transmitting film pattern with alignment on a substrate on which a pixel pattern is formed previously.

However, since it is necessary with these methods to effect an alignment operation between the pixel pattern and the non-light transmitting pattern, it is difficult with this precision to form a pattern of non-light transmitting pattern of a coincident size free of the light transmitting sections between the pixel patterns. If overlapped portions are produced, step differences are produced on a color filter, so that it becomes difficult to produce a color filter excellent in planarity.

With any of the above methods, high precision processing is required for alignment so that it is difficult to cope with the demand for a larger work size, that is a larger picture size with reduced costs.

SUMMARY OF THE INVENTION

It is an object of the present invention to provide a method for producing a color filter in which high precision fine machining technique is not required, the pattern figure of the colored layer has a high degree of freedom, non-light transmitting layers can be arrayed without gaps between the color filter pixels and the color filter size may be increased easily and in which mass production may be achieved easily and simply.

It is another object of the present invention to provide a method for producing a color filter in which the driving voltage can be lowered, and the light transmittance is not lowered and in which the step of forming a second transparent electrode is not necessitated.

The above and other objects of the invention will become apparent from the following description.

According to the present invention, there is provided a method for producing a color filter comprising the steps of:

(A) forming a photosensitive coating film on a transparent electrically conductive layer provided on an outermost surface of a substrate having an alignment film, and exposing the photosensitive coating film to light through a mask having patterns of at least three different degrees of light transmittances;

(B) developing and removing a photosensitive coating film portion registering with one of the patterns of smallest and largest degrees of light transmittances for exposing the transparent electrically conductive layer and electrodepositing a colored coating on the exposed electrically conductive layer for forming a colored layer thereon, operation of developing and removing the photosensitive coating film and electrodepositing the colored coating being repeated for the respective patterns of different degrees of light transmittances in sequence of difference in light transmittances to form different colored layers, respectively; and (Z) transcribing the colored layers, the transparent electrically conductive layer and the alignment film onto another substrate.

PREFERRED EMBODIMENTS OF THE INVENTION

Figure 1:
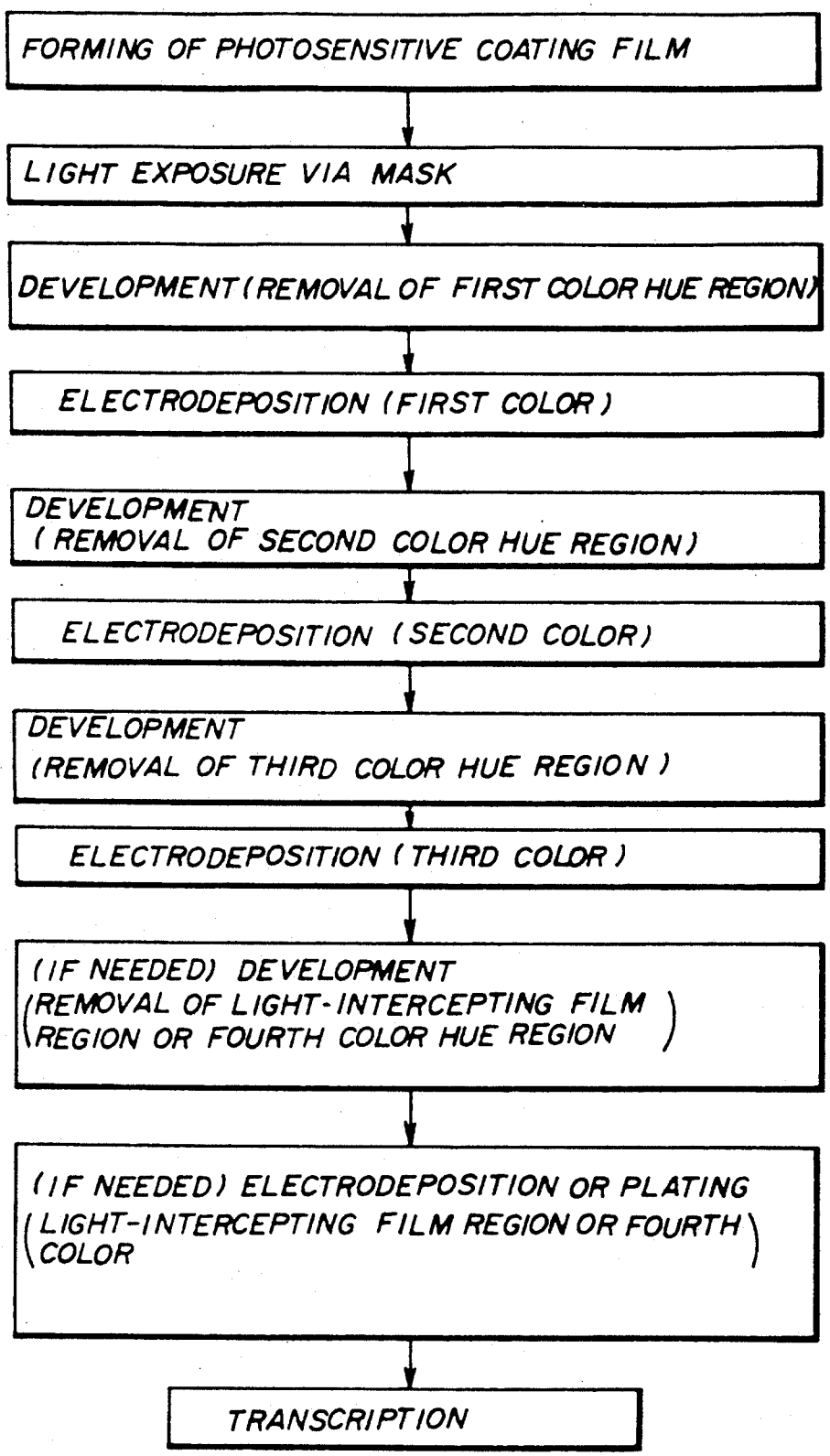
FIG. 1 is a process chart showing an embodiment of the present invention.

In the method for producing a color filter of the present invention, a photosensitive coating film is formed on a transparent electrically conductive layer provided on the outermost surface of a substrate having an alignment film and the photosensitive coating film is exposed to light through a mask having patterns of at least three different degrees of light transmittances. This step is referred to hereinafter as a step A.

According to the present invention, any plate-shaped substrate which is provided with an alignment film and the outermost surface of which is provided with a transparent electrically conductive layer, may be employed.

A material for the substrate may, for example, be metal or a plate-shaped insulator and may specifically include glass, a variety of laminated plates or a variety of plastic plates or metallic plates. The substrate surface may preferably be smooth in view of the color filter performance. If necessary, the substrate surface may be ground. For facilitating the transcription operation during the subsequent step, a release layer may be formed between the substrate surface and the alignment film. As the release layer, silicone or polytetrafluoroethylene thin films may be employed.

The alignment film employed in accordance with the present invention may be similar to that customarily employed in liquid crystal alignment films.

The material used for the alignment film may preferably be such a material as does not affect the performance required of the color filter, such as silica as an inorganic material, or polyimide, polyphenylene sulfide, epoxy resin or acrylic resin as organic materials.

The film thickness of the alignment film may preferably be 0.01 to 3 μm, depending on the performance required of the color filter. The alignment film may be formed by e.g. oblique vacuum deposition, grating or rubbing. The latter method is most preferred because it can be effected after the end of the transcription process. The alignment film may also be formed by polymerization on the substrate surface such as by plasma polymerization.

The transparent electrically conductive layer employed in the present invention may be formed of a material mainly composed of tin oxide, indium oxide, antimony oxide or mixtures thereof, and may preferably be 20 to 300 nm in thickness. There is no particular limitation as to be method of forming the transparent electrically conductive layer and any of the conventional methods, such as spraying, CVD, sputtering or vacuum deposition, may be employed. The transparent electrically conductive layer may preferably be of the highest degree of transparency as possible in view of the performance required of the color filter.

Although there is no limitation as to the methods of forming the photosensitive coating film on the transparent electrically conductive layer of the substrate, it may be formed by application on the transparent electrically conductive layer by any known method such as electrodeposition, spraying, dip coating, roll coating, screen printing or spin coating.

As the negative type photosensitive coating for forming the negative type photosensitive coating film, a negative type photosensitive coating resin exhibiting film forming capabilities and photosensitivity and a photopolymerization initiator may be dispersed or dissolved in a solvent such as an organic solvent or water so as to be used as a coating material. As the positive type photosensitive coating for forming the positive type photosensitive coating film, a positive type photosensitive coating resin exhibiting film coating capabilities and photosensitivity may be dispersed or dissolved in water or in an organic solvent so as to be used as a coating material. Dyes and/or pigments may be contained in the negative or positive type coatings. If the dyes and/or the pigments are of a color hue corresponding to that of the target color filter, the number of repetition of the step B later described may be correspondingly reduced.

The negative type photosensitive coating resin preferably employed in the present invention may include a prepolymer having photosensitive groups such as (meth)acryloyl groups, e.g. acryloyl or methacryloyl group, cinnamoyl groups or mixtures thereof at a terminal and/or side chain of the molecule, an onium group-containing cationic resin or a carboxylic group-containing anionic resin. The negative type-photosensitive coating resin may have a molecular weight ranging between 500 and 10,000.

The prepolymer may preferably be formed from epoxy (meth)acrylate, urethane (meth)acrylate, polyester (meth)acrylate, or mixtures thereof.

The onium group-containing cationic resins may be composed of a main resin, such as acrylic resin, polyester resin, maleinated oil resin, polybutadiene resin, epoxy resin, urethane resin, polyamide resin or mixtures thereof, and the photosensitive groups and onium groups, such as amino group, ammonium group, sulfonium group or mixtures thereof, introduced therein. These resins may preferably be processed with an acidic substance such as formic acid, acetic acid, propionic acid, lactic acid or mixtures thereof, and solubilized and/or dispersed in water.

The carboxyl group-containing anionic resins may be composed of the above mentioned main resin into which carboxylic groups and the aforementioned photosensitive groups are introduced. These resins may preferably be solubilized and/or dispersed in basic substances, such as triethylamine, diethylamine, dimethylethanol amine, ammonia or mixtures thereof.

There is no particular limitation to the positive type photosensitive coating resin, if it is dissolved in a developing solution on light exposure, and may be enumerated by resins including quinone diazido groups, resins including diazomeldrum's acid or nitrobenzyl ester, or resin compositions including these resins. Specific examples of these resins include a quinone diazido group-containing cationic resin in which the onium groups and hydroxyl groups are introduced into the above main resins, to which a quinone diazido sulfonic acid compound is added further by esterification reaction followed by being processed with an acidic substance such as formic acid, acetic acid, propionic acid, lactic acid or mixtures thereof and solubilized and/or dispersed in water; a quinone diazido group-containing anionic resin in which carboxyl groups and hydroxyl groups are introduced into the above mentioned main resins, to which a quinone diazido sulfonic acid compound is further added by an esterification reaction followed by being processed with basic substances e.g. triethylamine, diethylamine, dimethylethanol amine, ammonia or mixtures thereof, and solubilized and/or dispersed in water; a quinone diazido group-containing resin obtained by reacting a resin having film-forming capability and a hydroxyl group-compound with a quinone diazido compound including a quinone diazido sulfonic acid derivative or an isocyanate group; and resin compositions containing these resins. The mixing ratio for the resin compositions may be optionally selected depending on light exposure and development conditions.

As the negative type photosensitive coating resin and the positive type photosensitive coating resin, prepolymers or resins that may be solubilized and/or dispersed in water are most preferred for simplifying the process and combating the pollution.

The negative type photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol-di(meth)acrylate, trimethylolpropane triacrylate, pentaerythritol triacrylate, dipentaerythritol hexacrylate, tris(acryloyl oxyethyl) isocyanurate, and mixtures thereof. The proportion of these (meth) acrylates is preferably up to 50 and most preferably up to 30 parts by weight to 100 parts by weight of the negative type photosensitive coating resin. If the proportion of the (meth)acrylates exceeds 50 parts by weight, the coating becomes undesirably tacky.

The photopolymerization initiator employed in the negative type photosensitive coating may be any of those known in the art and may be enumerated by benzoins, benzoin ethers, benzylalkyl ketals, benzophenone derivatives, anthraquinone derivatives, thioxanthone derivatives or mixtures thereof. Sensitizers may be added thereto if so desired. The photopolymerization initiator may be added in an amount of 0.1 to 30 and preferably 0.5 to 20 parts by weight to 100 parts by weight of the negative type photosensitive coating resin. If the amount of the initiator is less than 0.1 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the negative and positive type photosenstive coating resins may be any of those capable of dispersing or dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether or triethyleneglycol dimethyl ether; ketones such as acetone, methylethyl ketone, methylisobutyl ketone, cyclohexanone or isophorone; ethers such as dibutyl ether, dioxane or tetrahydrofuran; alcohols such as methoxy butanol, diacetone alcohol, butanol or isopropanol; hydrocarbons such as toluene, xylene or hexane; esters such as ethyl acetate, butyl acetate, 2-methoxyethyl acetate, 2-methoxypropyl acetate or ethyl benzoate; acid amides such as dimethyl formamide, N,N-dimethyl acetoamide or dimethyl sulfoxide, and mixtures thereof.

These organic solvents may be added during solubilization or dispersion in water of the above mentioned cationic or anionic resins for improving bath stability or smoothing coating films.

Although the color hue of the dyes and/or pigments occasionally added to the above mentioned negative or positive type photosensitive coating may be suitably selected depending on the particular application, it is preferably dark and, above all, black, dark navy-blue, dark purple or dark brown, for avoiding light leakage.

The dyes and/or pigments are preferably so selected as not to lower the stability and occasionally electrodeposition properties as well as durability of the coating. For this reason, oil soluble or dispersible dyes, such as azo, anthraquinone, benzodifuranone, condensed methine series dyes, or mixtures thereof, are preferred. The pigments may be exemplified by organic pigments, such as azo lake organic pigments, quinacridone organic pigments, phthalocyanine organic pigments, isoindolinone organic pigments, anthraquinone organic pigments or thioindigo organic pigments; chrome yellow, iron oxide, chrome vermilion, chrome green, ultramarine, prussian blue, cobalt blue, cobalt green, emerald green, titanium white, carbon black or mixtures thereof. As for the color hue of the dyes and pigments, reference is had to "COLOUR INDEX" whenever necessity arises.

The amount of the dyes and/or the pigments is suitably selected depending on the application, color hue, the type of the dyes and/or the pigments or the film thickness of the photosensitive coating. The amount may preferably be 3 to 70 wt. % and more preferably 5 to 60 wt. % based on the total photosensitive coating.

Depending on the type and the amounts of the dyes and/or pigments, the produced coating film may be rendered light transmitting or light intercepting according to the intended applications. For example, black tinted light-intercepting coating film may be produced by using 3 to 50 wt. % of carbon black, as pigments, based on the total amount of the negative or positive type photosensitive coating. The black-hued light-intercepting coating film is particularly desirable for preventing light leakage. The color hue of the dyes and/or the pigments may include white color hue. The dyes and/or the pigments are preferably purified for removing impurities. The photosensitive coating may be admixed with various assistant agents, such as dispersants for the dyes and/or the pigments, levelling agents for improving smoothness of the coating film, viscosity adjustment agents or defoaming agents.

For producing the negative type photosensitive coating, the negative type photosensitive coating resins, the photopolymerization initiator and the solvent are sufficiently dispersed, using a dispersion apparatus, such as customary sand mills, roll mills or attriters. The positive type photosensitive coating may be prepared by mixing and dispersing the resins for the positive type photosensitive coating and the solvent in the same manner as for the negative type coating. The dyes, pigments, acidic or basic substances, dispersants, levelling agents for improving smoothness of the coating film, viscosity adjustment agents or defoaming agents may be mixed and dispersed as needed. There is no limitation to the film thickness of the photosensitive coating films formed by the photosensitive coating and the film thickness may be suitably selected depending on the performance desired of the color filter. The dry film thickness may be usually 0.3 to 20 $\mu$m and preferably 1 to 15 $\mu$m. The film thickness may be adjusted by controlling, for example electrodeposition conditions, such as voltage, electrodeposition time and bath temperature. However, film thickness adjustment may be usually made under the same conditions as those for electrodeposition coating of colored coatings, as will be explained subsequently.

According to the present invention, exposure of the photosensitive coating film is to be performed by using a mask having patterns of at least three different degrees of light transmittances. The light transmittance means an intensity ratio before and after transmission of the exposure light through the mask. At least three different light transmittance degrees of the mask patterns will suffice depending on the number of types of the colored coatings. The difference in the light transmittance degrees may be optionally determined depending on the conditions of light exposure and development. In general, the larger the relative difference in the respective light transmittances, the easier becomes the adjustment of light exposure time, which is more desirable. However, even if the difference in the light transmittances is small, the same objective may be achieved by enhancing the volume of light exposure or prolonging the light exposure time. Thus, a significant difference of 5% or more is desirable, although no limitations are placed on the relative difference in the light transmittances.

Light exposure may be usually achieved using a system radiating a large quantity of ultraviolet rays. For example, a high pressure mercury lamp, an ultra high pressure mercury lamp or a metal halide lamp may be used as a light source. If necessary, other radiation rays may also be employed. Light exposure conditions may be selected suitably depending on photosensitive coatings employed, light exposure devices and masks.

In the step A of the present invention, by effecting light exposure through a mask having patterns of at least three different degrees of light transmittances, a number of different exposure states which is the same as that of the different light transmittance degrees of the patterns may be provided in the photosensitive coating film.

In the method of the present invention, the step of forming a colored layer by applying a colored coating by electrodeposition on the transparent electrically conductive layer exposed after developing and removing the photosensitive coating film is repeated (step B), next to the step (A), in the order of the increasing light transmittance degrees of the patterns with use of the negative type photosensitive coating and in the order of the decreasing light transmittance degrees of the patterns with use of the positive type photosensitive coating, for producing the respective colored layers. That is, if the negative type photosensitive coating is employed, the portion of the photosensitive coating film corresponding to a pattern of the smallest degree of light transmittance of the patterns is selectively developed and removed, and the colored coating is electrodeposited on the exposed transparent electrically conductive layer to form a colored layer. The portion of the coating film corresponding to the second smallest light transmittance degree of the patterns is then selectively developed and removed and the colored coating is electrodeposited on the exposed electrically conductive layer to form a colored layer. This sequence of operations is repeated to produce the colored layers, respectively. If the positive type photosensitive coating is employed, the portion of the photosensitive coating film corresponding to a pattern of the largest light transmittance of the mask is selectively developed and removed and a colored coating is electrodeposited on the exposed transparent electrically conductive layer to form a colored layer. The portion of the coating film corresponding to the second largest light transmittance degree of the patterns is then selectively developed and removed and a colored coating is electrodeposited on the exposed electrically conductive layer to form a colored layer. This sequence is repeated to produce the respective colored layers.

The conditions for selectively developing and removing the photosensitive coating film may be changed depending on the volume of light exposure, solubility of the photosensitive coating in the developing solution, the types and the concentrations of the developing solution, development time and temperatures. Thus, the conditions may be suitably selected for the resin used for the preparation of the photosensitive coating. Specifically, aqueous solutions containing dissolved acidic materials may be used as a developing solution when the cationic resin is used as a component of the negative photosensitive coating. The acidic materials include organic acids, such as formic acid, acetic acid, propionic acid or lactic acid; inorganic acids, such as hydrochloric acid or phosphoric acid; and mixtures thereof. If lactic acid is used as a developing solution, it may be used at a concentration usually of 0.01 to 50 wt. % and preferably 0.05 to 25 wt. %. The developing temperature is usually 10° to 70° C. and preferably 15° to 50° C. and the developing time is usually 2 to 600 seconds and preferably 4 to 300 seconds. As a developing solution in case of employing an anionic resin as a component of the negative type photosensitive coating, an aqueous solution containing basic substances dissolved therein, may be employed. The basic substances may include sodium carbonate, sodium hydrogen carbonate, sodium metasilicate, tetraalkyl ammonium hydroxide, sodium hydroxide, potassium hydroxide and mixtures thereof. If an aqueous solution of sodium carbonate is used as a developing solution, sodium carbonate may be used in a concentration range of 0.01 to 25 wt. % and preferably 0.05 to 20 wt. % for development. The development time usually is selected within a range of 2 to 600 and preferably 4 to 300 seconds generally at 10° to 70° C. and preferably 15° to 50° C. A developing solution when the positive type photosensitive coating is employed may usually be an aqueous solution in which a basic material is dissolved. The basic material includes sodium carbonate, sodium hydrogen carbonate, sodium metasilicate, tetraalkyl ammonium hydroxide, sodium hydroxide, potassium hydroxide and mixtures thereof. For example, where an aqueous solution of sodium metasilicate is employed as a developing solution, development may be effected at the concentration of sodium metasilicate of 0.01 to 25 wt. % and preferably 0.05 to 20 wt. %. The developing temperature may usually be 10° to 70° C. and preferably be 15° to 50° C. and the developing time may be 2 to 600 seconds and preferably 4 to 300 seconds. For the developing solutions, organic solvents such as alcohols, glycol ethers, ketones, chlorinated hydrocarbons or mixtures thereof, may be employed. Surfactants or defoaming agents may also be added to these developing solutions for improving wettability or anti-foaming properties. Aqueous developing solutions are preferably employed in view of non-toxicity and sanitation in working environments.

After the development, colored coatings are electrodeposited on the exposed transparent electrically conductive layer for forming a colored layer.

In preparing the colored coating, cationic resins, anionic resins or photocurable resins are used as a film-forming component, and dyes and/or pigments are added as a colorant component. Acidic or basic substances may also be employed for dissolving and/or dispersing these components in water. Organic solvents may be added for facilitating dissolution and/or dispersion of the resins in the colored coating for improving bath stability or for producing smooth coating films.

The cationic resins may for example be resins composed of the main resins used in the photosensitive coating into which onium groups such as ammonium, sulfonium groups or amino groups are introduced, such as resins solubilized or dispersed in water with an acidic substance, such as formic acid, acetic acid, propionic acid, lactic acid or mixtures thereof.

The anionic resins may for example be resins composed of the main resins used in the photosensitive coating into which carboxyl groups, etc. are introduced, and may for example be resins solubilized or dispersed in water with basic substances such as triethylamine, diethylamine, dimethylethanol amine, ammonia or mixtures thereof.

As the photocurable resins, those prepolymers or resins containing acryloyl groups, methacryloyl groups, cinnamoyl groups or mixtures thereof, that are used in the photosensitive coating film in the step A and that are suited for electrodeposition, may be employed. The above mentioned photopolymerization initiators may also be employed in combination.

The colored coatings employed in step B may be different in type, color hue, color concentration or color brightness in the regions exhibiting different light transmittances. Alternatively, the same colored coatings may be used in common for these regions.

The color hue of the colored coating may be selected suitably, depending on particular applications. For example, the photosensitive coating used in step A, the colored coating used in step B and the colored coatings used in step B in case of repeating the electrodepositing process several times, may be those exhibiting different color hues.

The dyes and/or pigments used in the colored coatings may be suitably selected depending on the targeted color hue. It is, however, preferred to use those dyes and/or pigments which are not unsatisfactory in transparency, stability, electrodeposition properties and durability of the coating film. Particularly preferred are those dyes or pigments which may be mixed as the occasion may demand in the above mentioned photosensitive coatings.

In the preparation of the colored coatings, resins, dyes and/or pigments, acidic or basic substances, organic solvents, dispersants for the dyes or pigments, levelling agents for improving smoothness of the coating films, viscosity controlling agents or anti-foaming agents are mixed together and dispersed sufficiently in a conventional dispersion device such as sand mill, roll mill or attriter. The resulting dispersion is diluted in water to a predetermined concentration of about 4 to 25 wt. % and preferably to 7 to 20 wt. % of solid content to produce a coating suitable for electrodeposition. The so-produced coating may be applied on the electrically conductive layer by electrodeposition for providing a colored layer.

There is no particular limitation to the film thickness of the colored layer, which may be suitably selected depending on the performance required of a color filter. However, the dry thickness is usually 0.3 to 5 $\mu$m and preferably 1 to 3 $\mu$m.

Although the conditions of electrodeposition may be suitably selected depending on the types of the colored coatings and film thickness of the colored coating films, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15 to 30°C. After lapse of the electrodeposition time sufficient to produce a desired film thickness, current conduction is discontinued and the substrate is taken out of the bath. The substrate is freed of excess bath liquid by washing with water and dried to produce the colored layer.

Although the drying conditions may be selected suitably depending on the conditions of the subsequent process steps, it is usually preferred that the conditions be such that surface moisture is dried, for example, the drying time be of the order of 0.5 minute to 1 hour and preferably 1 to 30 minutes at a temperature of 120° C. or lower and preferably 30° to 100° C. If the drying temperature is higher than 120° C., the photosensitive coating film is occasionally cured under heat to raise difficulties in the subsequent development process.

In the method of the present invention, a step of developing and removing the photosensitive coating film registering with at least one of the patterns of different degrees of light transmittances and/or registering with that portion other than the patterns for exposing the electrically conductive layer and selectively forming a metal layer thereon (step C) and if necessary further electrodepositing a colored coating on the metal layer for forming a colored layer thereon (step D) may be carried out, if needed, prior to the step Z. It is preferred to form a metal layer selectively in the portion other than the pattern or patterns of the colored layer or layers obtained in step B. If the photosensitive coating film is formed using the negative type photosensitive coating, the step C and if necessary the step D may preferably be performed next to the step A and thereafter the step B is subsequently performed. On the other hand, if the photosensitive coating film is formed using the positive type photosensitive coating, the step B may preferably be performed next to the step A followed by performing the step C and if necessary the step D. That is, the steps B, C and D may be performed in any arbitrary sequence. If the negative type photosensitive coating film is formed, development may preferably be carried out prior to step B in an area exposed to the least amount of light for forming a metal layer. It is practically not inconvenient that the colored coating be electrodeposited on the metal layer during the step D. The color hue of the colored layer formed on the metal layer may preferably be of the dark color hue among the color hues of the colored coatings used in the step B.

The metal layer may be formed by developing and removing the photosensitive coating film registering with at least one of the patterns of different degrees of light transmittances and/or registering with that portion other than the patterns remaining on the substrate followed by processing the exposed electrically conductive layer by electroplating or non-electroplating method. Such processing may be suitably selected using a variety of commonly used plating solutions and processing conditions selected from the ordinary processing conditions in conformity with the performance required of the color filter.

Among metals that may be used for a metal layer, there are metal materials that may be processed by plating, such as metals, e.g. copper, nickel, chromium, silver and gold, alloys of two or more of these metal materials, and metals obtained by mixing two or more of the metal materials in a plating bath. The thickness of the metal layer may be selected suitably depending on the performance required of the color filter, and may preferably be of the order of 10 nm to 5 $\mu$m and preferably 10 nm to 3 $\mu$m. The color filter may be made planar if the metal layer is of a thickness substantially equal to that of the colored layers.

With the method of the present invention, since in the aforementioned step C the metal layer may be formed by, for example plating on a region of the electrically conductive layer selectively exposed, so that the metal layer may be formed in a self-aligned manner between the regions or gaps between the colored layers. With such color filter, not only the contrast and color purity are improved, but also the function as an electrode sub-line may be fulfiled, so that signal delay in large screen display or heating within the cell may be diminished.

With the method of the present invention, the step Z for transcription is performed, in which the colored layers obtained in step B, or at least the colored layers and the metal layer in case the step C is performed, or at least the colored layers, the metal layer and the colored layers on the metal layer in case the step D is performed, are transcribed onto another substrate or transcription substrate.

Although there is no limitation to the transcription substrate, it may be a transparent substrate, semi-transparent substrate or colored substrate, depending on the usage and application. Preferably, a transparent substrate, such as glass or plastics may be employed. Examples of the transparent substrates include glass, polyester, polysulfone, cellulose triacetate, polycarbonate, polyimide, polystyrene and polymethylpentene.

The transcription operation may be carried out under conditions in which the colored layers, the transparent electrically conductive layer and the alignment film are transcribed simultaneously onto the transcription substrate.

The transcribing conditions may be suitably selected as a function of the types of the substrate materials, the materials for the alignment film and the transparent electrically conductive layer, the properties of the resin used for the colored layers, surface state or type of the material of the transcription substrate, and transcription temperature, pressure or time. In general, the temperature may be from room temperature to 150° C. and preferably room temperature to 120° C. The pressure may preferably be 0.05 to 10 kgf/cm$^2$ and more preferably 0.1 to 5 kgf/cm$^2$. The transcription time is 2 seconds to 1 hour and, above all, 5 seconds to 30 minutes.

The pressure during transcription is applied by means of a press, a laminator or a rubber-coated roll, occasionally under heating. If the colored layers are photosensitive, it may be photocured by light irradiation for transcription and, if necessary, heating and light irradiation may be effected simultaneously. For facilitating the transcription, the surface of the transcription substrate may be coated with a photocurable, pressure-sensitive or hot-melt type transparent adhesive. Heating and light irradiation may also be further effected after termination of the transcription step to achieve sufficient curing as well as to improve weather resistance and resistance to chemicals. Specifically, such re-heating may preferably be effected at 50° C. to 250° C. and more preferably at 100° to 200° C. for 5 minutes to one hour and, above all, for 10 to 30 minutes, depending on the type of the resins employed. The substrate may be re-used after transcription.

The objective color filter may be prepared by the above steps A, B and Z and, if necessary, by additional steps C and D. If necessary, heating, curing, photocuring may be carried out further for further improving weather resistance and resistance to chemicals. The heating and curing conditions may include the temperature of 100° to 250° C. and preferably 150° to 250° C. and the curing time of 5 minutes to one hour and preferably 15 to 40 minutes.

The process of the present invention will be explained with reference to FIGS. 1 to 4 in a non-limiting sense.

Figure 2:
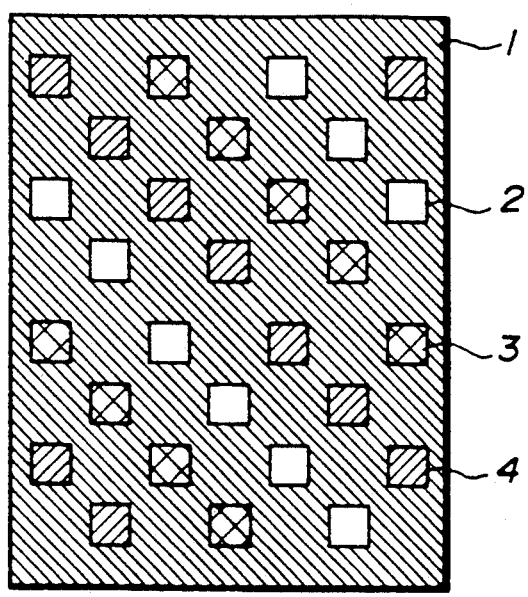
FIG. 2 is an enlarged schematic view of a mask employed in Examples 1, 2, 5 and 6 of the present invention.
Figure 3:
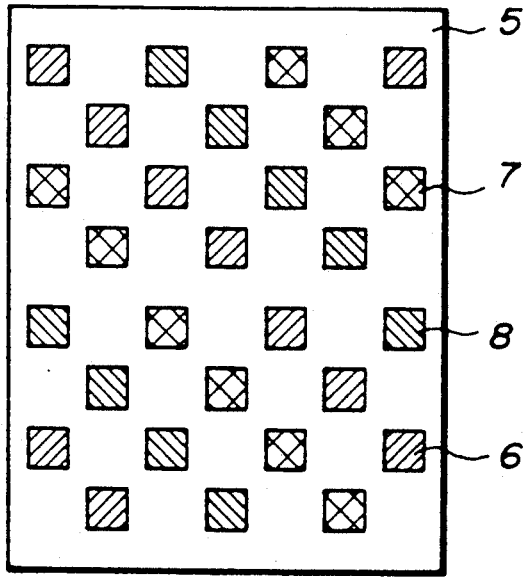
FIG. 3 is an enlarged schematic view of a mask employed in Examples 3, 4, 7, 8 and 9 of the present invention.
Figure 4:
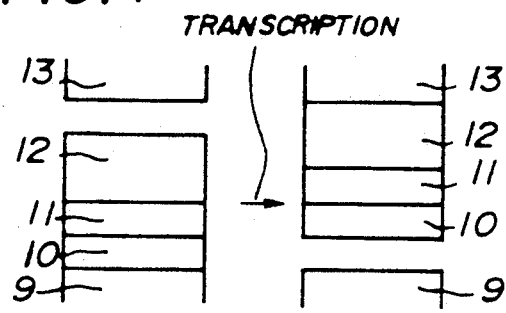
FIG. 4 is a schematic view showing a transcription step of the present invention.

FIG. 1 is a process chart showing an embodiment of the present invention. FIG. 2 is an enlarged schematic view of a mask having four different degrees of light transmittances, where 1 is a light intercepting film having 1% light transmittance or a mask region corresponding to a fourth color hue, 2 is a mask region corresponding to a first color hue with 100% light transmittance, 3 is a mask region corresponding to a second color hue with 25% light transmittance and 4 is a mask region corresponding to a third color hue with 5% light transmittance. FIG. 3 is an enlarged schematic view of a mask having four different degrees of light transmittances, where 5 is a light intercepting film with 100% light transmittance or a mask region corresponding to a fourth color hue, 6 is a mask region corresponding to a first color hue with 1% light transmittance, 7 is a mask region corresponding to a second color hue with 5% light transmittance and 8 is a mask region corresponding to a third color hue with 25% light transmittance. FIG. 4 is a process chart showing the transcription process where 9, 10, 11, 12 and 13 denote a substrate, an alignment film, a transparent electrically conductive layer, a colored layer and a metal layer, and a transcription substrate, respectively.

A photosensitive coating film is first formed on a transparent electrically conductive layer of a substrate having an alignment film and the aforementioned transparent electrically conductive layer on its outermost surface, using a positive type photosensitive resin or a negative type photosensitive resin, wherein the photosensitive coating film is black-hued if it is to be a light intercepting film and may be of any color hue if a metal light-intercepting layer is provided. After light exposure through a mask having four different degrees of light transmittances, as shown for example in FIG. 2 or 3, a first developing operation is carried out, whereby, if the positive type photosensitive resin is used, a transparent electrically conductive layer in register with a mask region 2 having the highest light transmittance is exposed, and, if the negative type photosensitive resin is used, the transparent electrically conductive layer in register with a mask region 6 having the lowest light transmittance is exposed. The so-processed substrate is immersed in an electrodeposition bath containing a colored coating of a first color for electrodeposition, followed by washing with water.

A second developing operation is carried out under conditions different from those for the first developing operation, for exposing the transparent conductive layer in register with a mask region 3 corresponding to a second color hue and having the second largest light transmittance or in register with a mask region 7 having the second smallest light transmittance. The so-processed substrate is immersed in an electrodeposition bath containing a colored coating of a second color hue for electrodeposition coating, followed by washing with water.

A third developing operation is carried out under conditions different from those for the first and second developing operations, for exposing the transparent electrically conductive layer in register with a mask region 4 corresponding to a third color hue with the third highest light transmittance or in register with a mask region 8 corresponding to a third color hue with the third lowest light transmittance. The so-processed substrate is immersed in an electrodeposition bath containing a third colored coating for electrodeposition coating, followed by washing with water. If the photosensitive coating film is black-hued, a colored layer inclusive of the light intercepting layer is formed after drying and the fourth developing operation as later described is not performed.

If the light intercepting layer is produced by electrodeposition or metal plating, the fourth developing operation is carried out under conditions different from those of the first to third developing operations for exposing the electrically conductive layer by developing and removing the photosensitive coating film in register with a mask region 1 corresponding to the fourth color hue region having the least light transmittance or in register with a mask region 5 corresponding to the fourth color hue region having the maximum light transmittance. A colored layer is formed by electrodeposition of the fourth color coating or a light-intercepting metal layer is formed by plating, and washed with water.

Referring to FIG. 4, the colored layer and the metal layer 12, formed on the alignment film 10 and the transparent electrically conductive layer 11 provided on the substrate 9, are transcribed to the transcription substrate 13 to produce a color filter of the present invention.

According to the present invention, a photosensitive coating produced by dissolving and/or dispersing a cationic resin in water may preferably be used to form the photosensitive coating film followed by forming a colored layer prepared from an anionic resin. Meanwhile, a photosensitive coating produced by dissolving and/or dispersing an anionic resin in water may also preferably be used followed by forming a colored layer prepared from a cationic resin.

With the method for producing the color filter according to the present invention, high precision fine processing is not required and the degree of freedom of the pattern shape of the colored layer may be increased, while patterning may be achieved by one time light exposure and the color filter size can be increased. Since there is no necessity of providing an electrode between the colored layer and the transparent substrate, the driving voltage may be lowered, and a color filter with the least risk of lowering the light transmittance may be mass-produced.

EXAMPLES OF THE INVENTION

The present invention will be explained hereinbelow with reference to Synthesis Examples and Examples which are given only for illustration and are not intended for limiting the invention.

SYNTHESIS EXAMPLE 1

Synthesis of Cationic Positive Type Photosensitive Resin (X-1)

Synthesis of Unsaturated Compound (X-1)

148 parts of glycidol, 0.8 part of dibutyl tin dilaurylate, 0.2 part of hydroquinone monomethyl ether and 82 parts of 2-ethoxyethyl acetate were charged into a 1 lit separable flask fitted with a thermometer, an agitator, a reflux cooling tube, a gas inlet pipe and a dropping funnel, and the temperature was raised to 50° C. 319 parts of methacryloyloxyethyl isocyanate were added dropwise over an hour as air was blown into the system and reaction was carried out until absorption of the isocyanate groups in IR absorption spectrum substantially disappeared. 276 parts of 4-hydroxy benzoic acid were added, and the temperature was raised to 110° C. After it was confirmed that the acid value was not more than 5 and the epoxide equivalent weight was not less than 11,000, the reaction was discontinued to produce an unsaturated compound (X-1).

Synthesis of Cationic Positive Type Photosensitive Resin (X-2)

238 parts of diethylene glycol monoethyl ether were charged into a 1 lit separable flask fitted with a thermometer, an agitator, a reflux cooling tube and a dropping funnel, and the temperature was raised to 130° C. Into this mixture, a mixed solution composed of 145 parts of (X-1), 83 parts of isobutyl methacrylate, 167 parts of ethyl acrylate, 78 parts of ethyl methacrylate, 41 parts of dimethylaminoethyl methacrylate and 12 parts of t-butyl peroxy-2-ethyl hexanoate were added dropwise over three hours. After lapse of 30 minutes, a mixed solution of 25 parts of diethylene glycol monoethyl ether and 2 parts of t-butyl peroxy-2-ethyl hexanoate was added dropwise over 30 minutes. The resulting mass was maintained at this temperature for two hours to terminate the reaction. 500 parts of the produced acrylic resin solution were taken into a 3 lit separable flask fitted with a thermometer, an agitator, a reflux cooling tube, a nitrogen inlet pipe and a dropping funnel. Into this mixture 1570 parts of acetone and 60.1 parts of 1,2-naphthoquinone diazido-5-sulfonyl chloride were added, and the resulting mass was agitated throughly at room temperature. Into the resulting mixture, 26.7 parts of triethylamine were added dropwise over an hour, and reaction was continued for further two hours. The produced solution was filtered to remove impurities. The resulting mass was added dropwise over about one hour into a 20-fold quantity of well-agitated water and precipitated resins were recovered. After removal of the moisture under reduced pressure, a brownish cationic positive type photosensitive resin (X-2) was produced.

Synthesis of Cationic Positive Type Photosensitive Coating (X-1)

500 g of a cationic positive type photosensitive resin (X-2) were dissolved in 333.3 g of methylethyl ketone. Then, 50 g of "CARBON BLACK #5B" produced by MITSUBISHI KASEI CORPORATION, were added under agitation for mixing and dispersion with the aid of a laboratory type three-roll roll mill produced by KODAIRA SEISAKUSHO KK until the carbon black reached a particle size of not more than 0.2 $\mu$m. A COULTER counter N4 produced by COULTER INC. was used for measuring the particle size. 11.7 g of acetic acid as a neutralizer were added to the resulting dispersion mixture and agitated sufficiently for re-homogenization. The resulting mass was dispersed under gradual addition of deionized water and under agitation vigorously with a high-speed mixer to produce an aqueous solution (cationic electrodeposition type) of black-hued cationic positive type photosensitive coating (X-1) having a solid concentration of 15 wt. %.

SYNTHESIS EXAMPLE 2

Synthesis of Anionic Positive Type Photosensitive Coating (X-2)

Synthesis of Anionic Resin (X-3)

1,000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 751 g of maleic anhydride, 10 g of xylene and 5.0 g of trimethyl hydroquinone, were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 480 mg KOH/g was produced.

Then, 500 g of the maleinated polybutadiene, 218 g of phenoxyethanol and 205 g of diethylene glycol dimethyl ether were charged into a 2 lit separable flask fitted with a reflux cooling tube, and dissolved homogeneously. Reaction was then carried out under nitrogen at 130° C. for three hours. Then, 61 g of benzylamine were added dropwise for 30 minutes at the same temperature and the temperature was raised to 165° C. Reaction was carried out at this temperature for seven hours to produce a solution of an anionic resin (X-3) containing half ester and imide groups.

Synthesis of Photosensitive Resin (X-4)

1000 g of "NISSEKI POLYBUTADIENE B-1000" (manufactures by NIPPON PETROCHEMICALS CO., LTD.; number average molecular weight, 1,000; iodine value, 430; content of 1,2-linkage, 65%), 388 g of maleic anhydride, 10 g of xylene and 3.0 g of trimethyl hydroquinone were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 320 mg KOH/g was produced.

Then, 500 g of the maleinated polybutadiene and 300 g of phenoxyethanol were charged into a 2 lit separable flask fitted with a thermometer, an agitator, a reflux cooling tube and a nitrogen blowing tube and dissolved homogeneously. Reaction was then carried out under nitrogen at 130° C. for three hours. After cooling to room temperature, 149 g of 2-(2-aminoethylamino)ethanol were added dropwise over an hour. The temperature was then raised to 125° C., at which temperature the reaction was carried out for four hours to produce a solution of polyamine resin containing imido groups.

Into a 5 lit separable flask fitted with a reflux cooling tube were charged 269 g of 1,2-naphthoquinone azido sulfonyl chloride, 1900 g of dioxane and 300 g of "KYOWAAD 1000" manufactured by KYOUWA CHEMICAL IND.. Then, 645 g of the polyamine resin solution were added dropwise at 30° C. over two hours and reaction was carried out at this temperature further for five hours. After the produced solution was filtered, 440 g of phenoxy ethanol was added and dioxane was removed under reduced pressure to produce a photosensitive resin (X-4).

The produced resin (X-4) in solution contained 150 mg equivalent of naphthoquinone diazido groups per 100 g of resin, and the non-volatile content amounted to 60.0 wt. %.

Synthesis of Anionic Positive Type Photosensitive Resin (X-5)

750 g of the (X-3) resin solution and 670 g of the (X-4) photosensitive resin were mixed thoroughly followed by adding 60 g of triethylamine for sufficient neutralization to produce an anionic positive type photosensitive resin (X-5) in solution.

Synthesis of Anionic Positive Type Photosensitive coating (X-2)

35 g of "CARBON BLACK #5B" produced by MITSUBISHI KASEI CORPORATION were added under agitation to 500 g of the anionic positive type photosensitive resin (X-5) in solution, and the resulting mixture was dispersed to obtain a carbon black particle size of 0.2 $\mu$m a less, using a laboratory type three-roll roll mill produced by KODAIRA SEISAKUSHO KK. Particle size was measured using a COULTER counter N4 manufactured by COULTER INC. The resulting mass was dispersed in water under gradual addition of deionized water and under agitation vigorously by a high speed mixer to produce an aqueous solution of black-hued anionic positive type photosensitive coating (X-2) (anionic electrodeposition type) having a solid concentration of 15 wt. %.

SYNTHESIS EXAMPLE 3

Synthesis of Cationic Negative Type Photosensitive Coating (X-3)

Synthesis of Amine-added Expoxidated Polybutadiene (X-6)

1,000 g of epoxidated liquid polybutadiene, manufactured by NIPPON PETROCHEMICALS CO., LTD. under the trade name of "E-1000-8", with a number average molecular weight of 1,000 and an oxirane oxygen content of 8%, were charged into a 2 lit separable flask, fitted with a thermometer, a stirrer and a reflux cooling pipe. After replacing the atmosphere within the system by nitrogen, 231.2 g of methylethanol amine were added and reaction was carried out at 170° C. for five hours. Non-reacted methylethanol amine was then distilled off under reduced pressure to produce amine-added epoxidated polybutadiene (X-6) with an amine value of 230.4 mmol/100 g.

Synthesis of Unsaturated Group-Containing Isocyanate Compound (X-7)

435.5 g of 2,4-tolylene diisocyanate and 266.1 g of diethylene glycol dimethyl ether were charged into a 2 lit round-bottom flask, which might be heated and cooled and which was fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to dropwise addition of 2-hydroxyethyl acrylate, the system was occasionally cooled for maintaining the constant temperature. After the end of the dropwise addition of 2-hydroxyethyl acrylate, the temperature was raised to 70° C., at which temperature the reaction was carried out for three hours. After the IR absorption spectral analyses revealed that the absorption intensity of the isocyanate groups was decreased to about one half that before start of the reaction, the reaction system was cooled to produce an unsaturated group-containing isocyanate compound (X-7).

Synthesis of Cationic Resin (X-8)

500 g of (X-6) were dissolved in 166.7 g of diethylene glycol dimethyl ether in a 2 lit separable flask. 713.4 g of (X-7), in which isocyanate groups are contained in an amount of 0.8 equivalent to 1 equivalent of hydroxyl groups, were added dropwise at 40° C., at which temperature the reaction was carried out for one hour. The IR absorption spectral analyses indicated that the isocyanate groups had disappeared. A cationic resin (X-8), in which (X-7) was added to (X-6), was produced.

Synthesis of Cationic Negative Type Photosensitive Coating (X-3)

To 500 g of a solution of cationic resin (X-8) were added, under agitation, 27.0 g of "IRGACURE 907" produced by CIBA GEIGY INC. as a photopolymerization initiator, 3.0 g of "KAYACURE DETX" produced by NIPPON KAYAKU CO., LTD., and 37.5 g of "CARBON BLACK #5B" produced by MITSUBISHI KASEI CORPORATION. The resulting mixture was dispersed by a laboratory type 3-roll roll mill produced by KODAIRA SEISAKUSHO KK until the carbon black reached the particle size of not more than 0.2 μm. Particle size was measured using a COULTER counter N4 produced by COULTER INC.

To the resulting dispersion mixture were added 16.7 g of acetic acid as a neutralizer and re-homogenized. The resulting mass was dispersed in water under gradual addition of deionized water and agitation vigorously by a high-speed mixer to produce an aqueous solution of black-hued cationic negative type photosensitive coating (X-3) (cationic electrodeposition type) having a solid concentration of 15 wt. %.

SYNTHESIS EXAMPLE 4

Synthesis of Anionic Negative Type Photosensitive Coating (X-4)

Synthesis of Half-Esterified Product (X-9) solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone were charged into a 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g was produced.

Then, 400 g of the maleinated polybutadiene and 188.5 g of diethylene glycol dimethyl ether and 0.4 g of hydroquinone were charged into a 2 lit flask fitted with a reflux cooling tube and the temperature was raised to 80° C. After the mixture was dissolved uniformly, 165.6 g of 2-hydroxyethyl acrylate and 20 g of triethylamine were added and reaction was carried out at 80° C. for two hours to produce a half-esterified product (X-9) in solution. The total acid value of the produced half-esterified product (X-9) in solution was 105 mg KOH/g and the non-voltile content amounted to 75.0 wt. %.

Synthesis of Anionic Negative Type Photosensitive Coating (X-4)

To 500 g of a produced half ester solution (X-9) were added, under agitation, 27.0 g of "IRGACURE 907" produced by CIBA GEIGY INC. as a photopolymerization initiator, 3.0 g of "KAYACURE DETX" produced by NIPPON KAYAKU CO., LTD., and 37.5 g of "CARBON BLACK #5B" produced by MITSUBISHI KASEI CORPORATION, and the resulting mass was dispersed by a laboratory type three-roll roll mill produced by KODAIRA SEISAKUSHO KK until the carbon black reached a particle size of 0.2 μm or less. The particle size was measured using a COULTER counter N4 produced by COULTER INC. To the resulting dispersion mixture, 33.7 g of triethylamine as a neutralizer were added and the resulting mass was agitated thoroughly for re-homogenization. The resulting mass was dispersed in water under gradual addition of deionized water and under agitation vigorously by a high-speed mixer to produce an aqueous solution of a black-hued anionic negative type photosensitive coating (X-4) (anionic electrodeposition type) having a solid concentration of 15 wt. %.

SYNTHESIS EXAMPLE 5

Synthesis of Cationic Positive Type of Photosensitive Coating (X-5)

500 g of the cationic positive type photosensitive resin (X-2) were dissolved in 333.3 g of methylethyl ketone. 11.7 g of acetic acid as a neutralizer was added and sufficiently mixed to be homogenized. The mixture was mixed vigorously with a high-speed mixer while deionized water was added slowly to be dispersed in water to produce an aqueous solution of the cationic positive type photosensitive coating (X-5) (cationic electrodeposition type).

SYNTHESIS EXAMPLE 6

Synthesis of Anionic Positive Type Photosensitive Coating (X-6)

To 500 g of a solution of the anionic positive type photosensitive resin (X-5), deionized water was added slowly, and the resulting mass was agitated vigorously with a high-speed mixer to be dispersed in water to produce an aqueous solution of an anionic positive type photosensitive coating (X-6) (anionic electrodeposition type).

SYNTHESIS EXAMPLE 7

Synthesis of Cationic Negative Type Photosensitive Coating (X-7)

To 500 g of the cationic resin (X-8), 27.0 g of "IRGACURE 907" produced by CIBA GEIGY INC. as a photopolymerization initiator and 3.0 g of "KAYACURE DETX", produced by NIPPON KAYAKU CO., LTD., were added under agitation for mixing. 16.7 g of acetic acid as a neutralizer were added and agitated thoroughly for re-homogenization. The resulting mass was agitated vigorously with a high-speed mixer, while deionized water was added slowly for dispersion in water to produce an aqueous solution of a cationic negative type photosensitive coating (X-7) (cationic electrodeposition type).

SYNTHESIS EXAMPLE 8

Synthesis of Anionic Negative Type Photosensitive Coating (X-8)

To 500 g of a solution of the half ester (X-9), 27.0 g of "IRGACURE 907" produced by CIBA GEIGY INC. as a photopolymerization initiator and 3.0 g of "KAYACURE DETX", produced by NIPPON KAYAKU CO., LTD., were added under agitation, and 33.7 g of triethyl amine as a neutralizer were added and agitated thoroughly for re-homogenization. The resulting mass was dispersed in water by vigorously agitating with a high-speed mixer under gradual addition of deionized water to produce an aqueous solution of anionic negative type photosensitive coating material (X-8) (anionic electrodeposition type).

SYNTHESIS EXAMPLE 9

Preparation of colored Coatings (Y-1, Y-2 and Y-3)

A solution of the cationic resin (X-8), a photopolymerization initiator and pigments were mixed under agitation and dispersed by a laboratory type three-roll roll mill produced by KODAIRA SEISAKUSHO KK until the pigment reached a particle size of 0.2 μm or less. The particle size was measured using a COULTER counter N4 produced by COULTER INC. To each resulting dispersion mixture was added acetic acid as a neutralizer and each of the mixtures was agitated thoroughly for re-homogenization. Each of the resulting masses was dispersed in water under gradual addition of deionized water and under agitation vigorously with a high-speed mixer, to produce each colored coating (Y-1, Y-2 and Y-3) having a solid concentration of 10 wt. %. The compositions of the aqueous solutions of the three-color colored coatings (cationic electrodeposition type) are shown in Table 1, where the numerical figures denote parts by weight.

TABLE 1

| Coating Color | Y-1 Red | Y-2 Green | Y-3 Blue |
|---|---|---|---|
| Cationic resin (x-8) solution | 213.3 | 213.3 | 213.3 |
| IRGACURE 907* | 11.5 | 11.5 | 11.5 |
| KAYACURE DETX** | 1.3 | 1.3 | 1.3 |
| Acetic acid (Neutralizer) | 19.8 | 19.8 | 19.8 |
| Phthalocyanine Blue*** | — | — | 20 |
| Phthalocyanine Green**** | — | 20 | — |
| Azo Metal Salt Red Pigment***** | 20 | — | — |

*"IRGACURE 907" mfd. by CIBA GEIGY INC.
**"KAYACURE DETX" mfd. by NIPPON KAYAKU CO., LTD.
***Phthalocyanine Blue "SR-150C" (mfd. by SANYO SHIKISO KK)
****Phthalocyanine Green "SAX" (mfd. by SANYO SHIKISO KK)
*****"PIGMENT RED 4BS" (mfd. by SANYO SHIKISO KK)

SYNTHESIS EXAMPLE 10

Preparation of Colored Coatings (Y-4, Y-5 and Y-6)

A solution of the half ester (X-9) and pigments were mixed under agitation and dispersed by a laboratory three-roll roll mill, produced by KODAIRA SEISAKUSHO KK, until the pigments reached the particle size of 0.2 μm or less. The particle size was measured with a COULTER counter N4 produced by COULTER INC. To each resulting dispersion mixture was added triethylamine as a neutralizer and agitated sufficiently for re-homogenization. Each of the resulting masses was dispersed in water under gradual addition of deionized water and mixed vigorously with a high-speed mixer to produce each colored coating (Y-4, Y-5 and Y-6) having a solid concentration of 10 wt. %. The compositions of the aqueous solutions of the produced three-color coatings (anionic electrodeposition type) are shown in Table 2, wherein the numerical figures stand for parts by weight.

TABLE 3

| Coating Color | Y-4 Red | Y-5 Green | Y-6 Blue |
|---|---|---|---|
| Half Ester (x-9) Solution | 213.3 | 213.3 | 213.3 |
| Triethylamine (Neutralizer) | 21.0 | 21.0 | 21.0 |
| Phthalocyanine Blue* | — | — | 20 |
| Phthalocyanine Green** | — | 20 | — |
| Azo Metal Salt Red Pigment*** | 20 | — | — |

*"SR-150C" manufactured by SANYO SHIKISO KK
**"SAX" manufactured by SANYO SHIKISO KK
***"Pigment Red 4BS" manufactured by SANYO SHIKISO

SYNTHESIS EXAMPLE 11

Preparation of Black-Hued Coating (Y-7)

To 500 g of a solution of the cationic resin (X-8) were added 27.0 g of "IRGACURE 907" produced by CIBA GEIGY INC. as a photopolymerization initiator, 3.0 g of "KAYACURE DETX" produced by NIPPON KAYAKU CO., LTD., and 37.5 g of "CARBON BLACK #5B", produced by MITSUBISHI KASEI CORPORATION, under agitation and the resulting mass was dispersed by a laboratory three-roll roll mill produced by KODAIRA SEISAKUSHO KK, until the carbon black reached a particle size of 0.2 μm or less. The particle size was measured using a COULTER counter N4 produced by a COULTER INC. To the resulting dispersion mixture were added 16.7 g of acetic acid as a neutralizer and agitated thoroughly for re-homogenization. The resulting mass was dispersed in water under gradual addition of deionized water and agitated vigorously by a high-speed mixer to produce a black-hued coating material (Y-7) (cationic electrodeposition type) having a solid concentration of 15 wt. %.

SYNTHESIS EXAMPLE 12

Preparation of Black-Hued Coating (Y-8)

To 500 g of a solution of the half ester (X-9) were added, under agitation, 27.0 g of "IRGACURE 907" produced by CIBA GEIGY INC. as a photopolymerization initiator, 3.0 g of KAYACURE DETX, produced by NIPPON KAYAKU CO., LTD. AND 37.5 g of "CARBON BLACK #5B" for mixing and the resulting mixture was dispersed by a laboratory three-roll roll mill, produced by KODAIRA SEISAKUSHO KK until the carbon black reached the particle size of 0.2 μm or less. The particle size was measured using a COULTER counter N4 produced by COULTER INC. To the resulting dispersion mixture were added 33.7 g of triethylamine as a neutralizer and agitated thoroughly for re-homogenization. The resulting mass was agitated vigorously by a high-speed mixer under gradual addition of deionized water for dispersion in water to produce a colored coating (Y-8) having a solid concentration of 15 wt. %.

SYNTHESIS EXAMPLE 13

Synthesis of UV Curable Type Pressure Sensitive Adhesive

A mixture of 80 parts by weight of 2-ethylhexyl acrylate, 5 parts by weight of tetrahydrofurfuryl acrylate, 15 parts by weight of acrylic acid, 4 parts by weight of α, α'-azobisisobutyronitrile and 200 parts by weight of toluene was reacted at 80° C. for eight hours under agitation in a $N_2$ flow to produce a copolymer solution. The solution was raised to a temperature of 100° C., and a mixed solution composed of 5 parts by weight of glycidyl methacrylate, 0.5 part by weight of triethyl benzyl ammonium chloride and 0.1 part by weight of methoquinone was added dropwise over 30 minutes. The reaction was carried out for 20 hours at the same temperature to produce a prepolymer. 5 parts by weight of "IRGACURE 907" produced by CIBA GEIGY INC. as a photopolymerization initiator were added to the produced prepolymer to produce a UV curable type pressure sensitive adhesive.

EXAMPLE 1

A polyimide film was formed to have a thickness of 0.8 μm by spin coating on a glass plate which in 1 mm in thickness and which had a silicone resin surface layer (50 nm thick). An ITO (indium-tin oxide) film was formed thereon to have a thickness of 200 nm by sputtering to form a substrate or master plate 1. Using the master plate 1 as a cathode, and a stainless steel beaker containing an aqueous solution of the black-hued cationic positive type photosensitive coating (X-1) as an anode, electrodeposition was carried out for 60 seconds under conditions of 25° C. and dc voltage of 40 V. After the master plate 1 was washed with ion-exchanged water and dried at 80° C. for five minutes and cooled to produce a black-hued uniform non-tacky coating film having a film thickness of 2 μm.

A positive mask having a pattern of light transmittance differing in four degrees was intimately contacted on the coating film, and irradiated with UV rays of 500 $mJ/cm^2$, using an UV exposure device having a high pressure mercury lamp produced by ORC MANUFACTURING CO., LTD. under the trade name of "JL-3300". After development with an aqueous solution of sodium metasilicate with a concentration of 0.3 wt. %, the black-hued positive type photosensitive coating in register with a positive mask region with the highest transmittance was selectively removed and the ITO film surface was exposed. After washing with water and drying, electrodeposition was carried out by applying a dc voltage of 25 V at 25° C. for three minutes, with the master plate 1 as a cathode and with a stainless steel beaker containing a colored coating (Y-1) as an anode. After the master plate 1 was washed with ion-exchanged water, it was dried at 80° C. for 5 minutes to form a red-hued layer in register with a mask region 2 which was 2 μm thick and which was not tacky at room temperature. After development with a 1.3 wt. % aqueous solution of sodium metasilicate, no change was noticed in the red-hued layer and the black-hued positive type photosensitive coating corresponding to a light intercepting layer, while the black-hued positive type photosensitive coating was selectively removed in a region in register with the positive mask region 3 exhibiting the second highest transmittance. After washing with water and drying, the colored coating (Y-2) was electrodeposited under conditions of dc voltage of 25 V and temperature of 25° C. for three minutes and washed with ion-exchanged water. The previously formed red-hued layer and the black-hued positive type photosensitive coating were not changed, and a green-hued layer in register with a mask region 3 was formed. After drying at 80° C. for 5 minutes and development with a 3.0 wt. % aqueous solution of sodium metasilicate, the red- and green-hued layers were not changed while the black-hued positive type photosensitive coating corresponding to the light intercepting film was not changed, while a region of the black-hued positive type photosensitive coating in register with the positive mask region 4 with the third highest light transmittance was selectively removed. After washing with water and drying, the colored coating (Y-3) was electrodeposited for three minutes under conditions of dc voltage of 25 V and temperature of 30° C., in the same manner as in electrodeposition of the colored coating material (Y-1). After the master plate 1 was washed with ion-exchanged water, the red- and green-hued layers and the black-hued positive type photosensitive coating corresponding to the light intercepting layer were not changed, while a blue-hued layer in register with the mask region 4 was formed. The colored layers having the light intercepting layer was produced after drying at 80° C. for five minutes.

The UV curable pressure sensitive adhesive prepared in Synthesis Example 13 was applied on a transparent glass substrate adapted for transcribing the colored layers, the transparent electrically conductive layer and the alignment film by spin coating to have a thickness of 0.1 μm. The colored layers of the master plate 1 were brought into contact with the adhesive by pressing with a rubber roll to transcribed the colored layers, the transparent electrically conductive layer and the polyimide film, and the master plate 1 was peeled off or delaminated. After baking at 150° C. for 30 minutes to complete the curing, a color filter having uniform colored layers with excellent transparency with the ITO film (transparent electrically conductive layer) and polyimide film on the surface of the colored layers was produced.

EXAMPLE 2

After the surface of a polytetrafluoroethylene plate 0.5 mm thick was rubbed by a rotary roll method, a polyimide film 0.5 μm thick was formed on the surface by spin coating, and an ITO film was formed thereon to have a thickness of 150 nm to produce a master plate 2. Using the master plate 2 as an anode and a stainless steel beaker containing an aqueous solution of the black-hued anionic positive type photosensitive coating (X-2) as a cathode, electrodeposition was carried out for two minutes under conditions of a dc voltage of 45 V and a temperature of 25°. The master plate 2 was washed with ion-exchanged water and dried at 80° C. for five minutes to produce a non-tacky black-hued uniform coating film with a film thickness of 1.8 μm.

Then, a positive mask having a transmittance pattern differing in four degrees, as shown in FIG. 2, was tightly contacted with the coating film, and was irradiated with UV rays of 500 mJ/cm$^2$, using a UV light exposure device similar to that used in Example 1. After development with a 0.5 wt. % aqueous solution of sodium metasilicate, the black-hued positive type photosensitive coating was selectively removed in a region in register with a positive mask region 2 having the highest transmittance to expose the ITO mask. After washing with water and drying, electrodeposition was carried out for three minutes under conditions of a dc voltage of 30 V and a temperature of 25° C., with the master plate 2 as a cathode and with a stainless steel beaker containing the colored coating (Y-1) as an anode. The master plate 2 was washed with ion-exchanged water and dried at 80° C. for five minutes to produce a red-hued layer in register with the mask region 2. After development with a 1.5 wt. % aqueous solution of sodium metasilicate, no changes were noticed in the red-hued layer or in the black-hued photosensitive coating portion corresponding to a light intercepting layer, while the black-hued photosensitive coating was selectively removed in a region in register with a positive mask region 3 having the second highest transmittance. After washing with water and drying, the colored coating (Y-2) was electrodeposited for three minutes under conditions of dc voltage of 30 V and temperature of 25° C., as in the case of electrodeposition of the colored coating material (Y-1), and the master plate 2 was washed with ion-exchanged water. It was found that no changes were noticed in the previously formed red-hued layer and in the black-hued positive type photosensitive coating region corresponding to the light intercepting layer, while a green-hued color layer in register with a mask region 3 was formed. After drying at 80° C. for 5 minutes and development with a 4 wt. % aqueous solution of sodium metasilicate, no changes were noticed in the red- or green-hued colored layers, or in the black-hued positive type photosensitive coating portion corresponding to the light-intercepting layer, while a region of the black-hued photosensitive coating was selectively removed which was in register with a mask region 4 having the third highest transmittance. After washing with water and drying, the colored coating (Y-3) was electrodeposited for three minutes under conditions of dc voltage of 30 V and a temperature of 25° C. in the same manner as for depositing the colored coating (Y-1). After washing the master plate 2 with ion-exchanged water, it was found that no changes were noticed in the previously formed red-hued layer, green-hued layer or in the black-hued positive type photosensitive coating portion corresponding to the light-intercepting layer, while a blue-hued color layer was formed. After drying at 80° C. for five minutes, the colored layers having the light-intercepting layer were produced.

The colored layers, the transparent electrically conductive layer and the polyimide film were then transcribed onto a transparent glass substrate, at a laminator pressure of 2 kgf/cm$^2$, roll temperature of 100° C. and a laminator speed of 300 mm/min, so that the glass substrate was contacted with the surface of the colored layers of the master plate 2, and the master plate 2 was peeled off. After baking for 20 minutes at 160° C. for completing the curing, a color filter having the ITO film (transparent electrically conductive layer) and the polyimide film on the upper surface of the uniform colored layers with excellent transparency was produced.

EXAMPLE 3

Electrodeposition was carried out for three minutes under conditions of a dc voltage of 30 V and a temperature of 25° C., using the same substrate as that used in Example 2, referred to hereinafter as a master plate 3, as a cathode, and a stainless steel beaker containing an aqueous solution of the black-hued cationic negative type photosensitive coating (X-3) as an anode. After washing the master plate 3 with ion-exchanged water followed by drying at 80° C. for five minutes and cooling, a black-hued uniform non-tacky coating film having a film thickness of 2 μm was formed.

A negative mask having a transmittance pattern changed in four degrees was intimately contacted with the coating film, and irradiated with UV rays of 500 mJ/cm$^2$, using an UV exposure device having a high pressure mercury lamp produced by ORC MANUFACTURING CO., LTD. under the trade name of "JL-3300". After development with a 0.05 wt. % aqueous solution of lactic acid, the black-hued negative type photosensitive coating film was selectively removed in a region in register with a negative mask region 6 having the lowest transmittance to expose the ITO film surface.

After washing with water and drying, electrodeposition was carried out for three minutes under conditions of a dc voltage of 25 V and a temperature of 25° C., using the master plate 3 as an anode and a stainless steel beaker containing the colored coating (Y-4) as a cathode. After washing the master plate 3 with ion-exchanged water and drying at 30° C. for five minutes, a red-hued colored layer in register with a mask region 6, which was 2 μm in thickness and which was not tacky at room temperature, was formed.

After development with a 0.5 wt. % aqueous solution of lactic acid, no changes were produced in the red-hued colored layer or in the black-hued negative type photosensitive coating film portion corresponding to the light-intercepting layer, and the black-hued negative photosensitive coating film was removed in a region thereof in register with a negative mask region 7 having the second lowest transmittance.

After washing with water and drying, the colored coating (Y-5) was electrodeposited for three minutes under conditions of a dc voltage of 25 V and a temperature of 25° C., in the same manner as for electrodeposition of the colored coating (Y-4). After washing with ion-exchanged water, no changes were noticed in the previously formed red-hued colored layer or in the black-hued negative type photosensitive coating film portion corresponding to the light-intercepting layer, while a green-hued colored layer in register with the mask region 7 was formed. After drying at 80° C. for five minutes followed by development with a 3.0 wt. % aqueous solution of lactic acid, no changes were noticed in the red- or green-hued colored layer or in the black-hued negative type photosensitive coating film portion corresponding to the light-intercepting film, and a region of the black-hued photosensitive coating film in register with the mask region 8 having the third lowest light transmittance was removed.

After water washing and drying, the colored coating (Y-6) was electrodeposited for three minutes under conditions of a dc voltage of 25 V and a temperature of 25° C., in the same manner as for electrodepositing the colored coating (Y-4). After washing the master plate 3 with ion-exchanged water, it was found that the previously formed red-hued or green-hued colored layers or the black-hued negative photosensitive coating film portion corresponding to the light-intercepting layer were not changed, while a blue-hued colored layer in register with the mask region 8 was formed. After drying at 80° C. for five minutes, the colored layers having the light-intercepting layer were formed.

The colored layers, the transparent electrically conductive layer and the polyimide film were transcribed, with a laminator pressure of 2 kgf/cm$^2$, a roll temperature of 100° C. and a laminator speed of 300 mm/min, so that the surfaces of the colored layers were contacted with the surface of the master plate 3. The master plate 3 was then peeled off. After baking at 160° C. for 20 minutes for completing curing, a color filter having the ITO film (transparent electrically conductive layer) and the polyimide film on the upper surface of the colored layers excellent transparency was produced.

EXAMPLE 4

Electrodeposition was carried out for 3 minutes under conditions of a dc voltage of 25 V and a temperature of 25° C., using the same substrate as that used in Example 1, referred to hereinafter as a master plate 4, as an anode, and a stainless steel beaker containing an aqueous solution of black-hued anionic negative type photosensitive coating (X-4) as a cathode.

After washing the master plate 4 with ion-exchanged water followed by drying at 80° C. for five minutes and cooling, a black-hued uniform coating film which was not tacky and 1.8 μm in thickness was produced.

A negative mask having a pattern of transmittance changed in four degrees as shown in FIG.3 was intimately contacted with the coating film, and irradiated with UV rays of 600 mJ/cm$^2$, using a UV exposure device employed in Example 1.

After development with a 0.1 wt. % aqueous solution of sodium carbonate, the black-hued negative type photosensitive coating film was selectively removed in a region thereof in register with a negative mask region 6 having the lowest transmittance, so that the ITO film was exposed.

After washing with water and drying, electrodeposition was carried out for three minutes under conditions of a dc voltage of 30 V and a temperature of 25° C., using the master plate 4 as a cathode and a stainless steel beaker containing the colored coating (Y-1) as an anode. The master plate 4 was washed with ion-exchanged water and dried at 80° C. for 5 minutes to produce a red-hued colored layer. After development with a 0.75 wt. % aqueous solution of sodium carbonate, no change were noticed in the red-hued colored layer or in the black-hued negative type photosensitive coating film corresponding to the light-intercepting layer, and the black-hued negative type photosensitive film was removed in a region thereof in register with a negative mask region 7 having the second lowest transmittance.

After washing with water and drying the colored coating (Y-2) was electrodeposited for three minutes under conditions of a dc voltage of 30 V and a temperature of 25° C., in the same manner as for electrodeposition of the colored coating (Y-1). After washing the master plate 4 with ion-exchanged water, no changes were produced in the previously formed red-hued colored layer or in the black-hued negative type photosensitive coating film portion corresponding to the light-intercepting layer, and a green-hued colored layer was formed. After drying at 80° C. for five minutes followed by development with a 5 wt. % aqueous solution of sodium metasilicate, no changes were produced in the red-hued or green-hued color layer or in the black-hued negative photosensitive coating film region corresponding to the light-intercepting layer, while the black-hued negative type photosensitive coating film was removed in a region thereof in register with a negative mask region 8 having the third lowest transmittance.

After washing with water and drying, the colored coating (Y-3) was electrodeposited for three minutes under conditions of a dc voltage 30 V and a temperature of 25° C., in the same manner as for electrodeposition of the colored coating (Y-1). After washing the master plate 4 with ion-exchanged water, it was found that no changes were produced in the previously formed red-hued color layer or in the green-hued color layer, or in the black-hued negative type photosensitive coating film region corresponding to the light-intercepting layer, while a blue-hued color layer in register with the mask region 8 was formed. After drying at 80° C. for five minutes, colored layers having the light intercepting layer were formed.

The colored layers, the transparent electrically conductive layer and the polyimide film were transcribed onto a transparent glass substrate, on which the UV curable pressure sensitive adhesive obtained in Synthesis Example 13 was previously applied by a spin coating method to have a thickness of 0.1 μm, so that the surface of the color layer of the master plate 4 was in contact with the glass substrate. After UV rays of 200 mJ/cm$^2$ were irradiated, the master plate 4 was peeled off. After baking at 150° C. for 30 minutes to complete the curing, a color filter having uniform colored layers superior in transparency and the ITO film (transparent electrically conductive layer) and the polyimide film on the upper surface of the colored layers was produced.

EXAMPLE 5

After rubbing the surface of a polytetrafluoroethylene plate 0.5 mm thick by a rotary roll method, a polyimide film was formed on the surface to have a thickness of 0.5 μm by spin coating. Electrodeposition was then effected for 60 seconds under conditions of a dc voltage of 40 V and a temperature of 25° C., using a substrate, on which an ITO film (indium-tin oxide film) was previously formed by sputtering to have a thickness of 150 nm, hereinafter referred to as a master plate 5, as a cathode, and a stainless steel beaker containing the cationic positive type photosensitive coating (X-5) as an anode. After washing the master plate 5 with ion-exchanged water followed by drying at 80° C. for five minutes and cooling a uniform coating film, which was not tacky and which was 2 μm in thickness, was formed.

A positive mask having a pattern of transmittance changed in four degrees was intimately contacted with the coating film, and irradiated with UV rays of 200 mJ/cm$^2$, using a UV exposure device employed in the Example 1.

After development with a 0.3 wt. % aqueous solution of sodium metasilicate, a region of the positive type photosensitive coating in register with the positive mask region 2 having the highest transmittance was selectively removed to expose the ITO film. After water washing and drying, electrodeposition was carried out for three minutes under conditions of a dc voltage of 25 V and a temperature of 25° C., using the master plate 5 as a cathode and a stainless steel beaker containing the colored coating (Y-1) as an anode. After washing the master plate 5 with ion-exchanged water and drying at 80° C. for five minutes, a red-hued colored layer in register with the mask region 2, which was not tacky at room temperature and which was 2 μm in film thickness, was produced.

After development with a 1.3 wt. % aqueous solution of sodium metasilicate, no changes were noticed in the red-hued color layer or in the positive type photosensitive coating film portion corresponding to the light-intercepting layer, while a region of the black-hued positive type photosensitive coating film in register with the positive mask region 3 having the second highest transmittance was selectively removed.

After washing with water and drying, electrodeposition was carried out for three minutes, under conditions of a dc voltage of 25 V and a temperature of 25° C., using the master plate 5 as a cathode and a stainless steel beaker containing the colored coating (Y-2) as an anode. After washing the master plate 5 with ion-exchanged water, no changes were noticed in the previously formed red-hued colored layer or in the positive type photosensitive coating film portion corresponding to the light intercepting layer, and a green-hued colored layer was formed. After drying at 80° C. for five minutes followed with development by a 3.0 wt. % aqueous solution of sodium metasilicate, no changes were produced in the red-hued colored layer or in the green-hued colored layer, or in the positive type photosensitive coating film portion corresponding to the light intercepting layer, and a region of the positive type photosensitive coating film in register with the positive mask region 4 having the third highest transmittance was selectively removed.

After washing with water and drying, electrodeposition was carried out for three minutes under conditions of a dc voltage of 25 V and a temperature of 25° C., using the master plate 5 as a cathode and a stainless steel beaker containing the colored coating (Y-3) as an anode. After washing the master plate 5 with ion-exchanged water, no changes were produced in the previously formed red-hued or green-hued layer, or in the positive type photosensitive coating film region corresponding to the light-intercepting layer, and a blue-hued color layer in register with the mask region 4 was formed. Drying was effected at 80° C. for five minutes.

After development with a 7.0 wt. % aqueous solution of sodium metasilicate, no changes were noticed in the colored layers, but the positive type photosensitive coating film region in register with the positive mask region 1 having the lowest transmittance was selectively removed.

After drying, baking was effected at 160° C. for 20 minutes for curing the produced colored layers.

Then, using the master plate 5 as a cathode, electroplating was effected for three minutes in a current density of 0.1 A/cm$^2$ in a Ni plating bath maintained at 45° C. After washing with water and drying, the master plate 5 having a non-lighttransmitting (light intercepting) Ni plated layer and the colored layers was produced.

On a transparent glass substrate, to which the produced colored layers, the Ni plated layer, the transparent electrically conductive layer and the oriented film were to be transcribed, the UV curable pressure-sensitive adhesive produced in Synthesis Example 13 was applied by spin coating to have a thickness of 0.1 μm, and pressed by a rubber roller so that the surface of the colored layers of the master plate 5 was contacted with the adhesive surface, for transcribing the colored layers, the Ni plated layer, the transparent electrically conductive layer and the polyimide layer onto the glass substrate. The master plate 5 was then peeled off. Baking was effected at 150° C. for 30 minutes to complete the curing. In this manner, a color filter having the ITO film (transparent electrically conductive layer) and the polyimide film on the upper surface of the colored layer with excellent transparency, was produced.

EXAMPLE 6

After the surface of a polytetrafluoroethylene plate 0.5 mm thick was rubbed by a rotary roll method, a polyimide film 0.5 μm in thickness was formed by spin coating on the surface. Electrodeposition was carried out for two minutes under conditions of a dc voltage of 45 V and a temperature of 25° C., using the substrate formed by depositing an ITO (indium-tin oxide) film 150 nm thick on the polyimide film by sputtering, referred to hereinafter as a master plate 6, as an anode, and using a stainless steel beaker containing an aqueous solution of anionic positive type photosensitive coating (X-6) as a cathode. After washing the master plate 2 with ion-exchanged water and drying at 80° C. for five minutes, a uniform non-tacky coating film having a film thickness of 2.0 μm was produced.

Then, a positive mask having a pattern of transmittance changed in four degrees shown in FIG. 2 was intimately contacted with the coating film, and irradiated with UV rays of 300 mJ/cm$^2$, using a UV exposure device similar to that used in Example 1. After development with a 0.5 wt. % aqueous solution of sodium metasilicate, the positive type photosensitive coating was selectively removed in a region thereof in register with the highest transmittance positive mask region 2 to expose the ITO film. After washing with water and drying, electrodeposition was carried out for three minutes under conditions of a dc voltage of 30 V and a temperature of 25° C., using the master plate 6 as a cathode, and a stainless steel beaker containing a colored coating (Y-1), as an anode. After washing the master plate 6 with ion-exchanged water, drying was effected at 80° C. for five minutes for forming a red-hued colored layer 2. Then, after development with a 1.5 wt. % aqueous solution of sodium metasilicate, no changes were noticed in the red-hued color layer and only a region of the positive type photosensitive coating in register with the positive mask region 3 having the second highest transmittance was selectively removed. After washing with water and drying, the colored coating (Y-2) was electrodeposited for three minutes under conditions of a dc voltage of 30 V and a temperature of 25° C., in the same manner as for electrodeposition of the colored coating (Y-1). The master plate 6 was then washed with ion-exchanged water. It was found that no changes were noticed in the previously formed red-hued color layer, and a green-hued color layer in register with the mask region 3 was formed. After drying at 80° C. for five minutes followed by development with a 4 wt. % aqueous solution of sodium metasilicate, no changes were produced in the red-hued or green-hued color layers and a region of the positive type photosensitive coating in register with the third highest transmittance positive mask region 4 was selectively removed. After washing with water and drying, the color coating (Y-3) was electrodeposited for three minutes under conditions of a dc voltage of 30 V and a temperature of 25° C. After washing the master plate 6 with ion-exchanged water, no changes were noticed in the previously formed red-hued or green-hued color layer, and a blue-hued colored layer in register with the mask region 4 was formed.

After drying at 80° C. for five minutes followed by development with a 7.0 wt. % aqueous solution of sodium metasilicate, no changes were produced in the colored layers and only the photosensitive coating film irradiated by the least light amount was selectively removed. After electrodeposition of the black-hued coating (Y-7) for three minutes under conditions of 30 V and 25° C., in the same manner as for electrodeposition of the colored coating (Y-1), followed by washing with ion-exchanged water, drying at 80° C. for five minutes and cooling, the master plate 6 having red-, green-, blue- and black-hued layers was produced.

The colored layers, the transparent electrically conductive layer and the polyimide layer were transcribed onto a transparent glass substrate, so that the surface of the colored layers of the master plate 6 was in contact with the substrate, under a laminator pressure of 2 kgf/cm, a roll temperature of 100° C. and a laminator speed of 300 mm/min, and the master plate 6 was peeled off. After baking at 160° C. for 20 minutes to complete the curing, a color filter having the ITO film (transparent electrically conductive layer) and a polyimide film on the upper surface of the uniform colored layer, superior in transparency, was produced.

EXAMPLE 7

Using the same substrate as that used in Example 6, referred to as a master plate 7, as a cathode, and a stainless steel beaker containing an aqueous solution of the cationic negative type photosensitive coating (X-7), as an anode, electrodeposition was effected for three minutes under conditions of a dc voltage of 30 V and a temperature of 25° C. After washing the master plate 7 with ion-exchanged water followed by drying at 80° C. for five minutes and cooling, a black-hued uniform coating film which was not tacky and which was 2 $\mu$m in film thickness, was produced.

A negative mask having a pattern of transmittance changed in four degreed as shown in FIG. 3 was intimately contacted with the coating film and irradiated with UV rays of 200 mJ/cm$^2$ using a UV exposure device as in Example 1. After development with a 0.05 wt. % aqueous solution of lactic acid, a region of the negative type photosensitive coating film in register with the lowest transmittance negative mask region 6 was selectively removed to expose the ITO film surface.

After washing with water and drying, electrodeposition was carried out for three minutes under conditions of a dc voltage of 25 V and a temperature of 25° C., using the master plate 7 as an anode and a stainless steel beaker containing the colored coating (Y-4) as a cathode. After washing the master plate 7 with ion-exchanged water, drying was carried out at 80° C. for five minutes for forming a red-hued color layer in register with the mask region 6 which was not tacky at room temperature and which was 2 $\mu$m in thickness.

After development with a 0.5 wt. % aqueous solution of lactic acid, no changes were noticed in the red-hued color layer or in the negative type photosensitive coating film corresponding to the light-intercepting layer, and the negative type photosensitive coating film was removed in a region thereof in register with the second lowest transmittance negative mask region 7.

After washing with water and drying, the colored coating (Y-5) was electrodeposited for three minutes under conditions of a dc voltage of 25 V and a temperature of 25° C., in the same manner as for electrodeposition of the colored coating (Y-4). After washing with ion-exchanged water, it was found that while no changes were noticed in the previously formed red-hued color layer or in the negative photosensitive coating film portion corresponding to the light-intercepting layer, a green-hued color layer in register with the mask region 7 was formed. After drying at 80° C., for five minutes and development with a 3.0 wt. % aqueous solution of lactic acid, it was found that while no changes were noticed in the red-hued colored layer or in the green-hued colored layer, or in the negative type photosensitive coating film portion corresponding to the light-intercepting film, the photosensitive coating film was removed in a region corresponding to the third lowest transmittance negative mask region 8.

After washing with water and drying, the colored coating (Y-6) was electrodeposited for three minutes under conditions of a dc voltage of 25 V and a temperature of 25° C. After washing the master plate 7 with ion-exchanged water, it was found that while no changes were produced in the previously formed red-hued or green-hued color layer or in the negative type photosensitive coating film portion corresponding to the light-intercepting layer, a blue-hued color layer in register with the mask region 8 was formed.

After drying at 80° C. for five minutes followed by development with a 7.0 wt. % aqueous solution of lactic acid, no changes were produced in the colored layers, while the coating film of the remaining cationic negative type photosensitive coating film, that is in the region irradiated with the maximum light volume, was selectively removed. The black-hued coating (Y-8) was electrodeposited for three minutes under conditions of a dc voltage of 25 V and a temperature of 25° C., with exposed ITO surface as an anode. After washing the master plate 7 with ion-exchanged water and drying at 80° C. for five minutes, the master plate 7 provided with a black-hued light-intercepting layer, 2 μm thick, not tacky at room temperature, and also provided with the black-hued, red-hued, green-hued and blue-hued colored layers, was produced.

The colored layers, the transparent electrically conductive layer and the polyimide layer were transcribed, with the laminator pressure of 2 kgf/cm², a roll temperature of 100° C. and the laminator speed of 300 mm/min, with the surface of the colored layers in contact with a transparent glass substrate, and the master plate 7 was peeled off. After baking at 160° C. for 20 minutes to complete the curing, a color filter having uniform colored layers with excellent transparency, the ITO film (transparent electrically conductive layer) and the polyimide film on the upper surface of the colored layers, was produced.

EXAMPLE 8

Using the same substrate as that used in Example 6, referred to hereinafter as a master plate 8, as an anode, and a stainless steel beaker containing an aqueous solution of the black-hued anionic negative type photosensitive coating (X-8), as a cathode, electrodeposition was carried for three minutes under conditions of a dc voltage of 25 V and a temperature of 25° C.

After washing the master plate 8 with ion-exchanged water, followed by drying at 80° C. for five minutes and cooling, a black-hued uniform coating film which was not tacky and which was 1.8 μm in thickness, was produced.

A negative mask, shown in FIG. 3, having a pattern of four different degrees of light transmittances, was intimately contacted with the coating film, and irradiated with UV rays of 300 mJ/cm², using a UV exposure device similar to that used in Example 1.

After development with a 0.1 wt. % aqueous solution of sodium carbonate, the negative type photosensitive coating film was removed selectively at a region corresponding to the lowest transmittance of the negative masks, so that the ITO film was exposed.

After washing with water and drying, electrodeposition was carried out for three minutes under conditions of a dc voltage of 30 V and a temperature of 25° C., using the master plate 8 as a cathode and a stainless beaker containing the colored coating (Y-1) as an anode. After washing of the substrate 8 with ion-exchanged water followed by drying at 80° C. for five minutes, a red-hued color layer was formed. After development with a 0.75 wt. % aqueous solution of sodium carbonate, no changes were noticed in the red-hued colored layer or in the negative type photosensitive coating film region corresponding to the light-intercepting layer, while the negative type photosensitive coating film was removed in a region in register with a second lowest transmittance negative mask region 7.

After washing with water and drying, the colored coating (Y-2) was electrodeposited for three minutes under conditions of a dc voltage of 30 V and a temperature of 25° C., in the same manner as for electrodeposition of the colored coating (Y-1). After washing the master plate 8 with ion-exchanged water, it was found that no changes were produced in the previously formed red-hued color layer or in the negative type photosensitive coating film region corresponding to the light-intercepting layer, while a green-hued colored layer was formed. After drying at 80° C. for five minutes followed by development with a 5.0 wt. % aqueous solution of sodium metasilicate, it was found that while no changes were caused in the red-hued or green-hued colored layer, or in the negative type photosensitive coating film region corresponding to the light-intercepting layer, the negative type photosensitive coating film was removed in a region corresponding to the third lowest transmittance negative mask region 8.

After washing with water and drying, the colored coating (Y-3) was electrodeposited for three minutes under conditions of a dc voltage of 30 V and a temperature of 25° C., in the same manner as for electrodeposition of the colored coating (Y-1). After washing the master plate 8 with ion-exchanged water, no changes were noticed in the previously formed red-hued or green-hued color layer or in the negative type photosensitive coating film region corresponding to the light-intercepting layer, while a blue-hued colored layer was foemed. After drying at 80° C. for five minutes followed by a development with a 7.0 wt. % aqueous solution of sodium metasilicate, no changes were seen in the colored layers while only the remaining region of the photosensitive coating film corresponding to the light-intercepting layer was selectively removed. After drying and baking at 160° C. for 20 minutes for curing the produced colored layers, electroplating was carried out for 2.5 minutes at a current density of 0.1 A/cm², in a copper plating bath maintained at 45° C., using the master plate 8 as a cathode. After washing with water and drying, the master plate 8 having non-lighttransmitting (light-intercepting) copper plated layer and the color layers was produced.

The colored layers, the copper plating layer, the transparent electrically conductive layer and the polyimide film were transcribed by a rubber roll onto a transparent glass substrate previously coated by spin coating with the UV curable pressure sensitive adhesive obtained in the Synthesis Example 13 to have a thickness of 0.1 μm, so that the surface of the colored layers of the master plate 8 is kept in contact with the substrate. After irradiation with the UV rays of 200 mJ/cm², the master plate 8 was peeled off. For completing the curing, baking was carried out at 150° C. for 30 minutes, whereby a color filter having uniform colored layers with excellent transparency and the ITO film (transparent electrically conductive layer) and the polyimide film on the upper surface of the colored layers was produced.

EXAMPLE 9

Electrodeposition was carried out for three minutes under conditions of a dc voltage of 30 V and a temperature of 25° C., using the same substrate as that used in example 6, referred to hereinafter as a master plate 9, as a cathode, and a stainless steel beaker containing an aqueous solution of a cationic negative type photosensitive coating (X-7), as an anode.

After washing the master plate 9 with ion-exchanged water followed by drying at 80° C. for five minutes and cooling, uniform non-tacky coating film with a film thickness of 2 μm was produced.

A negative mask, shown in FIG. 3, having a pattern of four different degrees of transmittances was intimately contacted with the coating film, and was irradiated with UV rays of 200 mJ/cm², using the UV exposure device used in Example 1.

After development with a 0.05 wt. % aqueous solution of lactic acid, the negative type photosensitive coating film was selectively removed in a region in register with the lowest transmittance relative mask region 6, so that the ITO film was exposed.

After washing with water and drying, electrodeposition was carried out for three minutes, under conditions of a dc voltage of 25 V and a temperature of 25° C., using the master plate 9 as an anode, and a stainless steel beaker containing the colored coating (Y-4), as a cathode. After washing the master plate 9 with ion-exchanged water and drying at 80° C. for five minutes, a red-hued colored layer in register with the mask region 6, which was not tacky at room temperature and which was 2 μm in film thickness, was produced. After development with a 0.5 wt. % aqueous solution of lactic acid, no changes were observed in the negative type photosensitive coating film region corresponding to the light-intercepting layer, while the negative type photosensitive coating film region in register with the second lowest transmittance negative mask region 7 was removed.

After washing with water and drying, the colored coating (Y-5) was electrodeposited for three minutes under conditions of a dc voltage of 25 V and a temperature of 25° C., in the same manner as for electrodeposition of the colored coating (Y-4). After washing the master plate 9 with ion-exchanged water, no changes were observed in the previously formed red-hued colored layer or in the negative type photosensitive coating film region corresponding to the light intercepting layer, while a green-hued colored layer in register with the mask region 7 was formed. After drying at 80° C. for five minutes followed by development with a 3.0 wt. % aqueous solution of lactic acid, it was found that while no change was noticed in the red-hued and green-hued colored layers or in the negative type photosensitive coating film corresponding to the light-intercepting layer, the negative type photosensitive film inregister with the mask region 8 having the third lowest transmittance was selectively removed.

After washing with water and drying, electrodeposition was carried out for 3 minutes under conditions for a dc voltage of 25 V and a temperature of 25° C., using the colored coating (Y-6), in the same manner as in the colored layer (Y-4). After washing the master plate 9 with ion exchanged water, no change was noticed in the previously formed red-hued or green-hued colored layer or in the negative type photosensitive coating film region corresponding to the light-intercepting layer and a blue-hued colored layer was formed.

After drying at 80° C. for five minutes followed by development with a 7.0 wt. % aqueous solution of lactic acid, no changes were caused in the colored layers, while the remaining cationic negative type photosensitive coating, i.e. the region irradiated with the maximum light volume, was selectively removed. After drying, baking was carried out at 160° C. for 20 minutes to cure the colored layer.

Electroplating was carried out for 2.5 minutes with a current density of 0.1 A/cm² in a copper plating bath, maintained at 45° C., using the master plate 9 as a cathode.

After washing with water and drying, the master plate 9 having colored layers and a non-lighttransmitting (light-intercepting) copper plated layer was produced.

The colored layers, the copper plated layer, the transparent electrically conductive layer and the polyimide layer were then transcribed by pressing with a rubber roll, onto a transparent glass substrate previously coated with the UV curable pressure sensitive adhesive produced in Synthesis Example 13 by the spin coating method, with the surface of the colored layers of the master plate 9 being in contact with the glass substrate. After irradiation with the UV rays of 200 mJ/cm², the master plate 9 was peeled off. After baking at 150° C. for 30 minutes to complete the curing, a color filter having uniform colored layers with excellent transparency and the ITO film (transparent electrically conductive layer) and the polyimide film on the upper surface of the color layers, was produced.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a color filter comprising the steps of:
    (A) forming a photosensitive coating film on a transparent electrically conductive layer provided on an outermost surface of a substrate having an alignment film, and exposing said photosensitive coating film to light through a mask having patterns of at least three different degrees of light transmittances;
    (B) developing and removing a photosensitive coating film portion registering with one of said patterns of smallest and largest degrees of light transmittances for exposing the transparent electrically conductive layer and electrodepositing a colored coating on the exposed electrically conductive layer for forming a colored layer thereon, operation of developing and removing the photosensitive coating film and electrodepositing the colored coating being repeated for the respective patterns of different degrees of light transmittances in sequence of difference in light transmittances to form different colored layers, respectively; and
    (Z) transcribing said colored layers, said transparent electrically conductive layer and said alignment film onto another substrate.

2. The method as claimed in claim 1 wherein said substrate having the transparent electrically conductive layer comprises a release layer between said alignment film and a surface of said substrate.

3. The method as claimed in claim 1 wherein said alignment film is made of a material selected from the group consisting of silica, polyimide, polyphenylene sulfide, epoxy resin, acrylic resin and mixtures thereof.

4. The method as claimed in claim 1 wherein said alignment film is produced by a method selected from the group consisting of an oblique vacuum deposition method, a grating method, a rubbing method and a plasma polymerization method.

5. The method as claimed in claim 1 wherein said photosensitive coating film is formed by a method selected from the group consisting of electrodeposition, spraying, dip coating, roll coating, screen printing and spin coating.

6. The method as claimed in claim 1 wherein said photosensitive coating film is formed of a negative type photosensitive coating containing a negative type photosensitive coating resin exhibiting coating film forming capability and photosensitivity, a photopolymerization initiator and a solvent selected from the group consisting of an organic solvent and water.

7. The method as claimed in claim 6 wherein said negative type photosensitive coating resin has a molecular weight ranging between 500 and 10,000.

8. The method as claimed in claim 6 wherein said negative type photosensitive coating resin is a prepolymer selected from the group consisting of epoxy (meth-)acrylate, urethane (meth)acrylate, polyester (meth)acrylate and mixtures thereof.

9. The method as claimed in claim 6 wherein said negative type photosensitive coating resin is an onium group-containing cationic resin prepared by introducing an onium group and a photosensitive group into a main resin and processing with an acidic material, said main resin being selected from the group consisting of acrylic resin, polyester resin, maleinated oil resin, epoxy resin, urethane resin, polybutadiene resin, polyamide resin and mixtures thereof, said onium group being selected from the group consisting of an amino group, an ammonium group, a sulfonium group and mixtures thereof, said photosensitive group being selected from the group consisting of an acryloyl group, a methacryloyl group, a cinnamoyl group and mixtures thereof, and said acidic material being selected from the group consisting of formic acid, acetic acid, propionic acid, lactic acid and mixtures thereof.

10. The method as claimed in claim 6 wherein said negative type photosensitive coating resin is a carboxyl group-containing anionic resin obtained by introducing a carboxyl group and a photosensitive group into a main resin and processing with a basic substance, said main resin being selected from the group consisting of acrylic resin, polyester resin, maleinated oil resin, polybutadiene resin, epoxy resin, urethane resin, polyamide resin and mixtures thereof, said photosensitive group being selected from the group consisting of an acryloyl group, a methacryloyl group, a cinnamoyl group and mixtures thereof, said basic substance being selected from the group consisting of triethylamine, diethylamine, dimethylethanol amine, ammonia and mixtures thereof.

11. The method as claimed in claim 6 wherein said photopolymerization initiator is selected from the group consisting of benzoins, benzoin ethers, benzylalkyl ketals, benzophenone derivatives, anthraquinone derivatives, thioxanthone derivatives and mixtures thereof.

12. The method as claimed in claim 6 wherein an added amount of said photopolymerization initiator is 0.1 to 30 parts by weight to 100 parts by weight of said negative type photosensitive coating resin.

13. The method as claimed in claim 6 wherein said organic solvent is selected from the group consisting of ethyleneglycol monobutyl ether, ethyleleglycol monohexyl ether, ethyleneglycol monophenyl ether, propyleneglycol monomethyl ether, propylneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethyl formamide, N,N-dimethyl acetoamide, dimethyl sulfoxide and mixtures thereof.

14. The method as claimed in claim 6 wherein said negative type photosensitive coating contains a colorant selected from the group consisting of dyes, pigments and mixtures thereof.

15. The method as claimed in claim 14 wherein said dyes comprise the group consisting of azo dyes, anthraquinone dyes, benzodifuranone dyes, condensed methine dyes and mixtures thereof.

16. The method as claimed in claim 14 wherein said pigments comprise the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

17. The method as claimed in claim 14 wherein said colorant is used in an amount of 3 to 70 wt. % based on a total amount of the negative type photosensitive coating.

18. The method as claimed in claim 1 wherein said photosensitive coating film is formed of a positive type photosensitive coating containing a positive type photosensitive coating resin having coating film forming capability and photosensitivity and a solvent selected from the group consisting of an organic solvent and water.

19. The method as claimed in claim 18 wherein said positive type photosensitive coating resin is a quinone diazido group-containing cationic resin obtained by introducing an onium group and a hydroxyl group into a main resin, adding a quinone diazido sulfonic acid compound by esterification reaction and processing with an acidic material, said main resin being selected from the group consisting of acrylic resin, polyester resin, maleinated oil resin, epoxy resin, urethane resin, polybutadiene resin, polyamide resin and mixtures thereof, said onium group being selected from the group consisting of an amino group, an ammonium group, a sulfonium group and mixtures thereof, and said acidic material being selected from the group consisting of formic acid, acetic acid, propionic acid, lactic acid and mixtures thereof.

20. The method as claimed in claim 18 wherein said positive type photosensitive coating resin is a quinone diazido group-containing anionic resin obtained by introducing a carboxyl group and a hydroxyl group into a main resin, adding a quinone diazido sulfonic acid compound by esterification reaction and processing with a basic substance, said main resin being selected from the group consisting of acrylic resin, polyester resin, maleinated oil resin, polybutadiene resin, epoxy resin, urethane resin, polyamide resin and mixtures thereof, and said basic substance being selected from the group consisting of triethylamine, diethylamine, dimethylethanol amine, ammonia and mixtures thereof.

21. The method as claimed in claim 18 wherein said positive type photosensitive coating resin is a quinone diazido group-containing resin obtained by reacting a resin having film forming capability and a hydroxyl group-containing compound with a quinone diazido compound, said quinone diazido compound being selected from the group consisting of a quinone diazido sulfonic acid derivative-containing quinone diazido compound and an isocyanate group-containing quinone azido compound.

22. The method as claimed in claim 18 wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethylformamide, N,N-dimethyl acetoamide, dimethyl sulfoxide and mixtures thereof.

23. The method as claimed in claim 18 wherein said positive type photosensitive coating contains a colorant selected from the group consisting of dyes, pigments and mixtures thereof.

24. The method as claimed in claim 23 wherein said dyes comprise the group consisting of azo dyes, anthraquinone dyes, benzodifuranone dyes, condensed methine dyes and mixtures thereof.

25. The method as claimed in claim 23 wherein said pigments comprise the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, carbon black and mixtures thereof.

26. The method as claimed in claim 23 wherein 3 to 70 wt. % of said colorant is contained based on total weight of said positive type photosensitive coating.

27. The method as claimed in claim 1 wherein said mask is a negative mask and wherein said sequence is in an order of increasing light transmittances.

28. The method as claimed in claim 1 wherein said mask is a positive mask and wherein said sequence is in an order of decreasing light transmittances.

29. The method as claimed in claim 1 wherein said photosensitive coating film is developed and removed by a developing solution selected from the group consisting of an aqueous solution containing an acidic material dissolved therein, an aqueous solution containing a basic material dissolved therein, alcohols, glycol ethers, ketones and chlorinated hydrocarbons.

30. The method as claimed in claim 29 wherein said acidic material is selected from the group consisting of formic acid, acetic acid, propionic acid, lactic acid, hydrochloric acid, phosphoric acid and mixtures thereof.

31. The method as claimed in claim 29 wherein said basic material is selected from the group consisting of sodium carbonate, sodium hydrogen carbonate, sodium metasilicate, tetraalkyl ammonium hydroxide, sodium hydroxide, potassium hydroxide and mixtures thereof.

32. The method as claimed in claim 1 wherein said photosensitive coating film is developed and removed under conditions of a temperature of 10° to 70° C. and a developing time of 5 to 600 seconds.

33. The method as claimed in claim 1 wherein said colored coating is obtained by processing a film-forming component and a colorant component with a material selected from the group consisting of an acidic substance and a basic substance, said film-forming component being selected from the group consisting of cationic resins, anionic resins and photocurable resins, said colorant component being selected from the group consisting of dyes, pigments and mixtures thereof, said acidic substance being selected from the group consisting of formic acid, acetic acid, propionic acid, lactic acid and mixtures thereof, and said basic substance being selected from the group consisting of triethylamine, diethylamine, diethylethanol amine, ammonia and mixtures thereof.

34. The method as claimed in claim 33 wherein said film-forming component comprises a cationic resin obtained by introducing an onium group into a main resin, said main resin being selected from the group consisting of acrylic resin, polyester resin, maleinated oil resin, epoxy resin, urethane resin, polybutadiene resin, polyamide resin and mixtures thereof, and said onium group being selected from the group consisting of an amino group, an ammonium group, a sulfonium group and mixtures thereof.

35. The method as claimed in claim 33 wherein said film-forming component comprises an anionic resin obtained by introducing a carboxyl group into a main resin selected from the group consisting of acrylic resin, polyester resin, maleinated oil resin, polybutadiene resin, epoxy resin, urethane resin, polyamide resin and mixtures thereof.

36. The method as claimed in claim 33 wherein said photocurable resins contain a functional group selected from the group consisting of an acryloyl group, a methacryloyl group, a cinnamoyl group and mixtures thereof in a molecule thereof.

37. The method as claimed in claim 33 wherein said photocurable resins comprise a photopolymerization initiator selected from the group consisting of benzoins, benzoin ethers, benzylalkyl ketals, benzophenone derivatives, anthraquinone derivatives, thioxanthone derivatives and mixtures thereof.

38. The method as claimed in claim 33 wherein said dyes comprise the group consisting of azo dyes, anthraquinone dyes, benzodifuranone dyes, condensed methine dyes and mixtures thereof.

39. The method as claimed in claim 33 wherein said pigments comprise the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

40. The method as claimed in claim 1 wherein said colored coating is electrodeposited at an electrical voltage of 5 to 500 V dc for a time interval of 5 to 300 seconds and at a liquid temperature of 10° to 35° C.

41. The method as claimed in claim 1 wherein said another substrate is a transparent substrate selected from the group consisting of glass, polyester, polysulfone, cellulose triacetate, polycarbonate, polyimide, polystyrene and polymethylpentene.

42. The method as claimed in claim 1 wherein said step (Z) is carried out under conditions of a transcription temperature ranging from room temperature to 150° C., a transcription pressure of 0.05 to 10 kgf/cm$^2$ and a transcription time of 2 seconds to 1 hour.

43. The method as claimed in claim 1 wherein an adhesive selected from the group consisting of a photocurable adhesive, a pressure-sensitive adhesive, a hot-melt adhesive, and mixtures thereof is applied on said another substrate before said step (Z) is performed.

44. The method as claimed in claim 1 further comprising a step of heating at 50° to 250° C. for 5 minutes to one hour after said step (Z) is performed.

45. The method as claimed in claim 1 further comprising a step of photocuring after said step (Z) is performed.

46. The method as claimed in claim 1 further comprising, after said step (A) and before said step (Z), a step (C) for developing and removing said photosensitive coating film registering with at least one of said patterns of different degrees of light transmittances and that portion other than the patterns to expose the transparent electrically conductive layer followed by selectively forming a metal layer thereon.

47. The method as claimed in claim 46 further comprising a step (D) for electrodepositing a colored coating on said metal layer formed in said step (C).

48. The method as claimed in claim 46 wherein a metal of said metal layer is selected from the group consisting of copper, nickel, chromium, silver, gold, an alloy thereof and mixtures thereof.

* * * * *

UNITED STATES PATENT AND TRADEMARK OFFICE
CERTIFICATE OF CORRECTION

PATENT NO. : 5,214,541
DATED : May 25, 1993
INVENTOR(S) : Yamasita et al.

It is certified that error appears in the above-identified patent and that said Letters Patent is hereby corrected as shown below:

In column 35, line 60, please change "ethyleleglycol" to --ethyleneglycol--.

In column 37, line 5, please change "ethylglycol" to --ethyleneglycol--.

Signed and Sealed this

Twenty-ninth Day of March, 1994

*Attest:*

BRUCE LEHMAN

*Attesting Officer*    *Commissioner of Patents and Trademarks*